(12) United States Patent
Ozaki et al.

(10) Patent No.: US 12,111,375 B2
(45) Date of Patent: Oct. 8, 2024

(54) MAGNETIC RESONANCE IMAGING APPARATUS, IMAGE GENERATING METHOD AND COMPUTER-READABLE NON-VOLATILE STORAGE MEDIUM STORING MEDICAL IMAGE PROCESSING PROGRAM

(71) Applicant: CANON MEDICAL SYSTEMS CORPORATION, Otawara (JP)

(72) Inventors: Masanori Ozaki, Hachioji (JP); Masao Yui, Otawara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 112 days.

(21) Appl. No.: 17/808,405

(22) Filed: Jun. 23, 2022

(65) Prior Publication Data

US 2023/0014564 A1 Jan. 19, 2023

(30) Foreign Application Priority Data

Jul. 19, 2021 (JP) .................................. 2021-118783

(51) Int. Cl.
*G01R 33/561* (2006.01)
*G01R 33/44* (2006.01)
(Continued)

(52) U.S. Cl.
CPC ......... *G01R 33/561* (2013.01); *G01R 33/446* (2013.01); *G01R 33/5605* (2013.01); *G01R 33/5613* (2013.01); *G01R 33/4833* (2013.01)

(58) Field of Classification Search
CPC ............ G01R 33/4833; G01R 33/5605; G01R 33/5608; G01R 33/5613; G01R 33/5615
See application file for complete search history.

(56) References Cited

U.S. PATENT DOCUMENTS

2004/0061496 A1 4/2004 Ookawa
2011/0288402 A1 11/2011 Pikkemaat et al.
(Continued)

FOREIGN PATENT DOCUMENTS

EP 2 199 815 A1 6/2010
JP 2004-24783 A 1/2004

OTHER PUBLICATIONS

Extended European Search Report issued Nov. 22, 2022 in European Patent Application No. 22185142.1, 13 pages.
(Continued)

*Primary Examiner* — Steven L Yeninas
(74) *Attorney, Agent, or Firm* — Oblon, McClelland, Maier & Neustadt, L.L.P.

(57) ABSTRACT

An MRI apparatus according to an embodiment includes sequence controlling circuitry, in a first transition period, repeating application of a first MT pulse and acquisition of a first MR signal to a first frequency region being a part of a k-space; in the first steady state, repeating application of the first MT pulse and acquisition of a second MR signal to a second frequency region of the k-space, frequency in second frequency region being lower than frequency in the first frequency region; and in a second transition period, repeating application of a second MT pulse and acquisition of a third MR signal to a third frequency region being another part of the k-space, frequency in the third frequency region being higher than the frequency in the second frequency region, and processing circuitry generating one MR image on basis of the first, second, and third MR signal.

15 Claims, 13 Drawing Sheets

(51) Int. Cl.
    *G01R 33/483*    (2006.01)
    *G01R 33/56*     (2006.01)

(56) References Cited

U.S. PATENT DOCUMENTS

2017/0371016 A1* 12/2017 Miyoshi ............. G01R 33/5607
2020/0256939 A1*  8/2020 Wang ................... G01R 33/543
2023/0014564 A1*  1/2023 Ozaki ................ G01R 33/5605

OTHER PUBLICATIONS

Jones et al., "In Vivo Three-Dimensional Whole-Brain Pulsed Steady-State Chemical Exchange Saturation Transfer at 7 T", Magnetic Resonance in Medicine, vol. 67, No. 6, 2012, pp. 1579-1589, XP055288966.

Lee et al., "Optimization of Keyhole Imaging Parameters for Glutamate Chemical Exchange Saturation Transfer MRI at 7.0 T", Molecular Imaging & Biology, vol. 22, No. 4, Dec. 19, 2019, pp. 924-930, XP037187029.

* cited by examiner

MAGNETIC RESONANCE IMAGING APPARATUS, IMAGE GENERATING METHOD AND COMPUTER-READABLE NON-VOLATILE STORAGE MEDIUM STORING MEDICAL IMAGE PROCESSING PROGRAM

CROSS-REFERENCE TO RELATED APPLICATIONS

This application is based upon and claims the benefit of priority from Japanese Patent Application No. 2021-118783, filed on Jul. 19, 2021; the entire contents of which are incorporated herein by reference.

FIELD

Embodiments described herein relate generally to a magnetic resonance imaging apparatus, an image generating method and a computer-readable non-volatile storage medium storing a medical image processing program.

BACKGROUND

In recent years, there are an increasing number of methods by which a calculation map is generated from a plurality of images of certain image types using mutually-different magnetization transfer (MT) pulses. Examples include an MTRasym map based on Chemical Exchange Saturation Transfer (CEST), an MTR map, and an ihMTR map. In order to achieve a steady state of image contrast with the various image types using the mutually-different MT pulses, it is necessary to apply an MT pulse multiple times before acquiring the data of each image type. For this reason, the imaging time period of an imaging process for the various image types using the mutually-different MT pulses is longer than that of an imaging process that does not use mutually-different MT pulses. Further, when a plurality of MT image types are acquired, the imaging time period becomes even longer.

DETAILED DESCRIPTION

Figure 1:
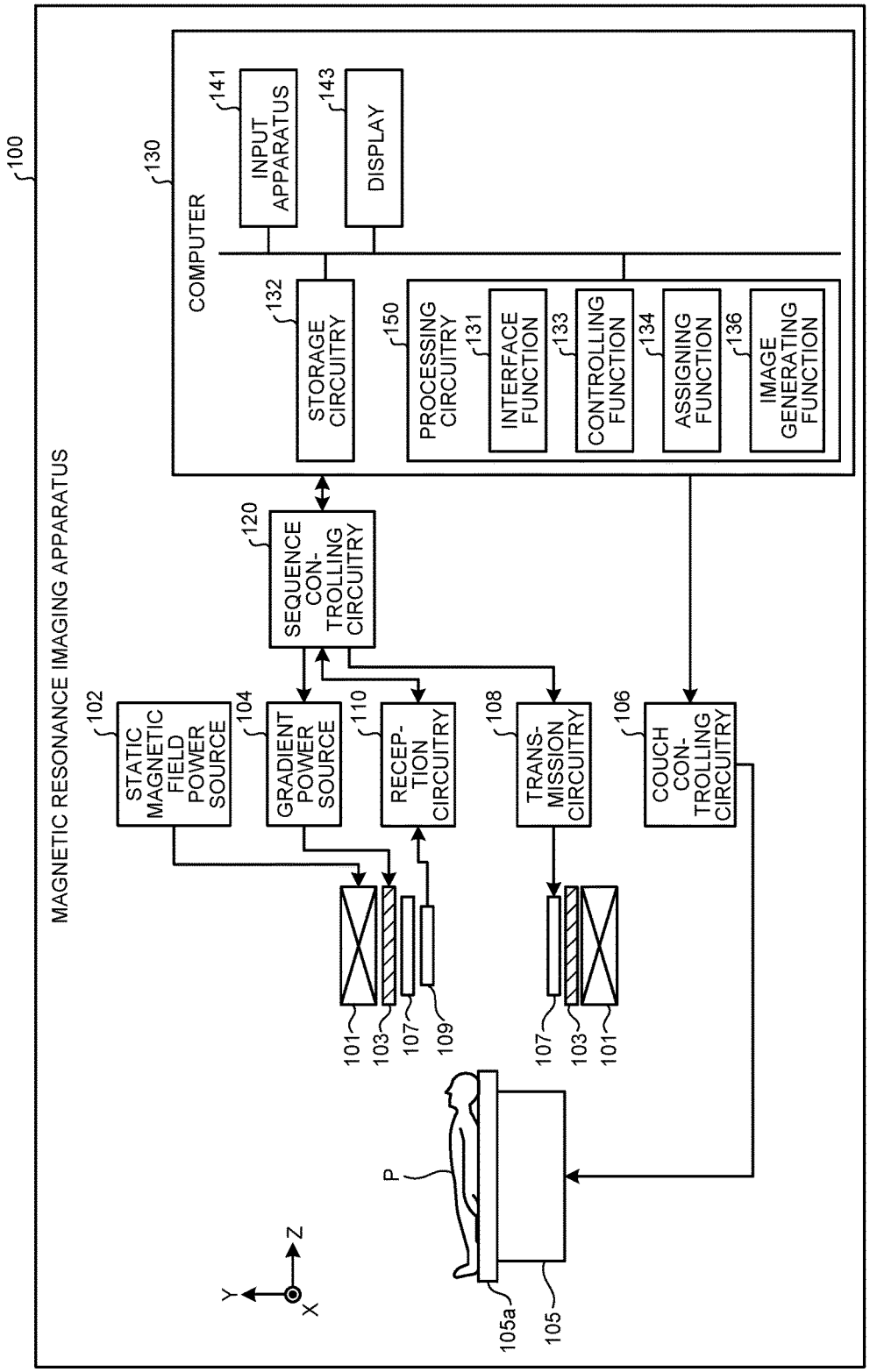
FIG. 1 is a block diagram illustrating a magnetic resonance imaging apparatus according to an embodiment.

A magnetic resonance imaging apparatus according to an embodiment includes sequence controlling circuitry and processing circuitry. The sequence controlling circuitry is configured to: in a first transition period in which a first Magnetization Transfer (MT) pulse is applied repeatedly until magnetization is transited to a first steady state, repeat application of the first MT pulse and acquisition of a first Magnetic Resonance (MR) signal corresponding to a radio frequency region that is a part of a k-space; in the first steady state, repeat application of the first MT pulse and acquisition of a second MR signal corresponding to a low frequency region of the k-space; and in a second transition period in which a second MT pulse, which is different from the first MT pulse, is applied repeatedly until the magnetization is transited to a second steady state, repeat application of the second MT pulse and acquisition of a third MR signal corresponding to a further radio frequency region that is another part of the k-space different from the radio frequency region. The processing circuitry is configured to generate one MR image on basis of the first MR signal, the second MR signal, and the third MR signal.

Exemplary embodiments of a magnetic resonance imaging apparatus (hereinafter, "MRI apparatus") and an image reconstruction method will be explained below, with reference to the accompanying drawings. Possible embodiments are not limited to the embodiments described below. Further, the description of each of the embodiments is, in principle, similarly applicable to any other embodiment. In the following embodiments, some of the elements referenced by using mutually the same reference characters are assumed to perform the same operations, and duplicate explanations thereof will be omitted, as appropriate.

EMBODIMENTS

FIG. 1 is a block diagram illustrating an MRI apparatus 100 according to an embodiment. As illustrated in FIG. 1, the MRI apparatus 100 includes a static magnetic field magnet 101, a static magnetic field power source 102, a gradient coil 103, a gradient power source 104, a couch 105, couch controlling circuitry 106, a transmission coil 107, transmission circuitry 108, a reception coil 109, reception circuitry 110, sequence controlling circuitry 120, and a computer 130 (which may be referred to as an image processing device). In this situation, the MRI apparatus 100 does not include an examined subject (hereinafter, "patient") P (e.g., a human body). Further, the configuration illustrated in FIG. 1 is merely an example. For instance, any of the constituent elements of the sequence controlling circuitry 120 and the computer 130 may be integrated together or separated, as appropriate.

The static magnetic field magnet 101 is a magnet formed so as to have a hollow substantially circular cylindrical shape and is configured to generate a static magnetic field in a space on the inside thereof. For example, the static magnetic field magnet 101 is a superconductive magnet or the like and is configured to excite magnetism by receiving a supply of an electric current from the static magnetic field power source 102. The static magnetic field power source 102 is configured to supply the electric current to the static magnetic field magnet 101. In another example, the static magnetic field magnet 101 may be a permanent magnet, and in that situation, the MRI apparatus 100 does not need to include the static magnetic field power source 102. Further, the static magnetic field power source 102 may be provided separately from the MRI apparatus 100.

The gradient coil 103 is a coil formed so as to have a hollow substantially circular cylindrical shape and is arranged on the inside of the static magnetic field magnet 101. The gradient coil 103 is formed by combining together three coils corresponding to X-, Y-, and Z-axes orthogonal to one another. By individually receiving a supply of an electric current from the gradient power source 104, the three coils are configured to generate gradient magnetic fields of which magnetic field intensities change along the X-, Y-, and Z-axes. The gradient magnetic fields generated along the X-, Y-, and Z-axes by the gradient coil 103 are, for example, a slice gradient magnetic field Gs, a phase encoding gradient magnetic field Ge, and a read-out gradient magnetic field Gr. The gradient power source 104 is configured to supply the electric currents to the gradient coil 103.

The couch 105 includes a couchtop 105a on which the patient P is placed and is configured, under control of the couch controlling circuitry 106, to insert the couchtop 105a into the hollow (an image taking opening) of the gradient coil 103, while the patient P is place thereon. Usually, the couch 105 is installed so that the longitudinal direction thereof is parallel to the central axis of the static magnetic field magnet 101. Under control of the computer 130, the couch controlling circuitry 106 is configured to drive the couch 105, so as to move the couchtop 105a in longitudinal directions and up-and-down directions.

The transmission coil 107 is arranged on the inside of the gradient coil 103 and is configured to generate a radio frequency magnetic field by receiving a supply of a Radio Frequency (RF) pulse from the transmission circuitry 108. The transmission circuitry 108 is configured to supply the RF pulse corresponding to a Larmor frequency determined by the type of targeted atoms and the magnetic field intensity, to the transmission coil 107.

The reception coil 109 is arranged on the inside of the gradient coil 103 and is configured to receive a magnetic resonance signal (hereinafter, "MR signal") emitted from the patient P due to influence of the radio frequency magnetic field. Upon receipt of the MR signal, the reception coil 109 is configured to output the received MR signal to the reception circuitry 110.

The transmission coil 107 and the reception coil 109 described above are merely examples. It is possible to configure the transmission coil 107 and the reception coil 109 by selecting one or combining two or more from among: a coil having only the transmitting function; a coil having only the receiving function; and a coil having the transmitting and receiving functions.

The reception circuitry 110 is configured to detect the MR signal output from the reception coil 109 and to generate MR data on the basis of the detected MR signal. More specifically, the reception circuitry 110 is configured to generate the MR data by digitally converting the MR signal output from the reception coil 109. Further, the reception circuitry 110 is configured to transmit the generated MR data to the sequence controlling circuitry 120. Alternatively, the reception circuitry 110 may be provided for a gantry device which includes the static magnetic field magnet 101, the gradient coil 103, and the like.

The sequence controlling circuitry 120 is configured to perform an imaging process on the patient P, by driving the gradient power source 104, the transmission circuitry 108, and the reception circuitry 110, on the basis of sequence information transmitted from the computer 130. In this situation, the sequence information is information defining a procedure for performing the imaging process and may be referred to as a sequence condition. The sequence information defines: the magnitude of the electric current to be supplied to the gradient coil 103 by the gradient power source 104 and the timing with which the electric current is to be supplied; the magnitude of the RF pulse to be supplied to the transmission coil 107 by the transmission circuitry 108 and the timing with which the RF pulse is to be applied; the timing with which the MR signal is to be detected by the reception circuitry 110; and the like. For example, the sequence controlling circuitry 120 may be integrated circuitry such as an Application Specific Integrated Circuit (ASIC) or a Field Programmable Gate Array (FPGA) or an electronic circuit such as a Central Processing Unit (CPU) or a Micro Processing Unit (MPU). The sequence controlling circuitry 120 corresponds to a sequence controlling unit.

Further, upon receipt of the MR data from the reception circuitry 110 as a result of imaging the patient P by driving the gradient power source 104, the transmission circuitry 108, and the reception circuitry 110, the sequence controlling circuitry 120 is configured to transfer the received MR data to the computer 130.

The computer 130 is configured to control the entirety of the MRI apparatus 100, to generate images, and the like. The computer 130 includes storage circuitry 132, an input apparatus 141, a display 143, and processing circuitry 150. The processing circuitry 150 includes an interface function 131, a controlling function 133, an assigning function 134, and an image generating function 136.

Processing functions performed by the interface function 131, the controlling function 133, the assigning function 134, and the image generating function 136 are stored in the storage circuitry 132 in the form of computer-executable programs. The processing circuitry 150 is a processor configured to realize the functions corresponding to the programs by reading and executing the programs from the storage circuitry 132. In other words, the processing circuitry 150 that has read the programs has the functions illustrated within the processing circuitry 150 in FIG. 1.

Further, although the example was explained with reference to FIG. 1 in which the single processing circuitry (i.e., the processing circuitry 150) realizes the processing functions performed by the interface function 131, the controlling function 133, the assigning function 134, and the image generating function 136, it is also acceptable to structure the processing circuitry 150 by combining together a plurality of independent processors, so that the functions are realized as a result of the processors executing the programs.

In other words, each of the abovementioned functions may be structured as a program, so that the single processing circuitry (i.e., the processing circuitry 150) is configured to execute the programs. Alternatively, one or more specific functions may be installed in a dedicated and independent program executing circuitry.

The term "processor" used in the above explanations denotes, for example, a CPU, a Graphical Processing Unit (GPU), or a circuit such as an application specific integrated circuit or a programmable logic device (e.g., a Simple Programmable Logic Device [SPLD], a Complex Programmable Logic Device [CPLD], or a Field Programmable Gate Array [FPGA]). The one or more processors are configured to realize the functions by reading and executing the programs saved in the storage circuitry 132.

Alternatively, instead of having the programs saved in the storage circuitry 132, it is also acceptable to directly incorporate the programs in the circuitry of the one or more processors. In that situation, the one or more processors realize the functions by reading and executing the programs incorporated in the circuitry thereof. Similarly, the couch controlling circuitry 106, the transmission circuitry 108, the reception circuitry 110, and the like are each also configured by using an electronic circuit such as the processor described above.

By employing the interface function 131, the processing circuitry 150 is configured to transmit the sequence information to the sequence controlling circuitry 120 and to receive the MR data from the sequence controlling circuitry 120. Further, upon receipt of the MR data, the processing circuitry 150 including the interface function 131 is configured to store the received MR data into the storage circuitry 132. The processing circuitry 150 realizing the interface function 131 corresponds to an interface unit. The MR data stored in the storage circuitry 132 is arranged in a k-space by the controlling function 133. The storage circuitry 132 is configured to store therein k-space data.

The storage circuitry 132 is configured to store therein the MR data received by the processing circuitry 150 including the interface function 131, the k-space data arranged in the k-space by the processing circuitry 150 including the assigning function 134, image data generated by the processing circuitry 150 including the image generating function 136, and the like. For example, the storage circuitry 132 is realized by using a semiconductor memory element such as a Random Access Memory (RAM) or a flash memory, or a hard disk, an optical disk, or the like.

The input apparatus 141 is configured to receive various types of instructions and inputs of information from a user. For example, the input apparatus 141 is a pointing device such as a mouse or a trackball, a selecting device such as a mode changing switch, an inputting device such as a keyboard, and/or the like. Under control of the processing circuitry 150 including the controlling function 133, the display 143 is configured to display a Graphical User Interface (GUI) used for receiving an input of image taking conditions, an image generated by the processing circuitry 150 including the image generating function 136, and the like. For example, the display 143 is a displaying device such as a liquid crystal display monitor.

By employing the controlling function 133, the processing circuitry 150 is configured to exercise overall control of the MRI apparatus 100 and to control imaging processes, image generating processes, image displaying processes, and the like. For example, the processing circuitry 150 including the controlling function 133 is configured to receive the input of the image taking conditions (e.g., an imaging parameter) through the GUI and to generate the sequence information according to the received image taking conditions. Further, the processing circuitry 150 including the controlling function 133 is configured to transmit the generated sequence information to the sequence controlling circuitry 120. The processing circuitry 150 realizing the controlling function 133 corresponds to a controlling unit. By employing the image generating function 136, the processing circuitry 150 is configured to read the k-space data from the storage circuitry 132 and to generate an image by performing a reconstruction process such as a Fourier transform on the read k-space data. The processing circuitry 150 realizing the image generating function 136 corresponds to an image generating unit.

A Chemical Exchange Saturation Transfer (CEST) effect related to the present embodiment will briefly be explained. In free water (bulk water) protons and polymer protons are exchanged with each other. For example, protons of a polymer such as an amide group (—NH), a hydroxyl group (—OH), or an amino group (—NH2) are exchangeable protons. The CEST effect can be described by using an amount called a "Z spectrum" or an "MTRasym spectrum". Imaging processes related to the CEST effect are based on an MR imaging method that utilizes the phenomenon in which protons in an amide group (—NH), a hydroxyl group (—OH), or an amino group (—NH2) are exchanged with protons in free water.

An MT effect related to the present embodiment will be explained. The MT effect (which may also be referred to as Magnetization Transfer Contrast [MTC]) is used, for example, for generating an image that utilizes image contrast between blood (a blood flow) and a tissue for purposes including, but not limited to, MR Angiography (MRA). The MT effect is based on a chemical exchange or cross relaxation between free water (bulk water) and any of various types of polymers or based on a chemical exchange or cross relaxation between protons (e.g., hydrogen protons) in a plurality of types of proton pools such as dipole relaxation. Each of the plurality of types of proton pools may contain protons coupled by using mutually-different methods and may have a Larmor frequency different from that of the protons in another one of the proton pools.

The MT effect can be indicated in a Magnetization Transfer Ratio (MTR) map using an MT method or an inhomogeneous MTR (ihMTR) map using an ihMT method. For example, the MTR map is a map image in which a value of a Magnetization Transfer Ratio (MTR) calculated with respect to each of the pixels on the basis of an acquired MR signal is arranged in the corresponding pixel. The MTR map is an image indicating a distribution of the MTR values. For example, the MTR map is a map image in which the value of the MTR calculated with respect to each of the pixels on the basis of an acquired MR signal is arranged in the corresponding pixel. The MTR map corresponds to an image (an MTR image) indicating the distribution of the MTR values.

For example, the ihMTR map is a map image in which a value of an inhomogeneous Magnetization Transfer Ratio (ihMT Ratio) calculated with respect to each of the pixels on the basis of an acquired MR signal is arranged in the corresponding pixel. The ihMTR map corresponds to an image (an ihMTR image) indicating a distribution of the ihMTR values.

According to a magnetic resonance imaging method related to the CEST effect and the MT effect, the sequence controlling circuitry 120 is configured to apply, to the patient P, a frequency-selective Radio Frequency (RF) pulse (hereinafter, "Magnetic Transfer [MT] pulse") prior to acquiring an MR signal, at a frequency (an off-resonance frequency) that is different from the resonance frequency of free water and is equal to a resonance frequency of exchangeable protons (e.g., protons of a polymer). The MT pulse corresponds to a preparation pulse.

In the following sections, to explain a specific example, a situation using an imaging method (hereinafter, "MT imaging method") related to the MT effect will be explained. In this situation, it is assumed that an image generated by the image generating function 136 is, for example, an image (hereinafter, "MT map image") such as an MTR image or an ihMTR image. As explained above, because the MT map image is derived from calculation, the MT map image may be called a calculation image.

Figure 2:
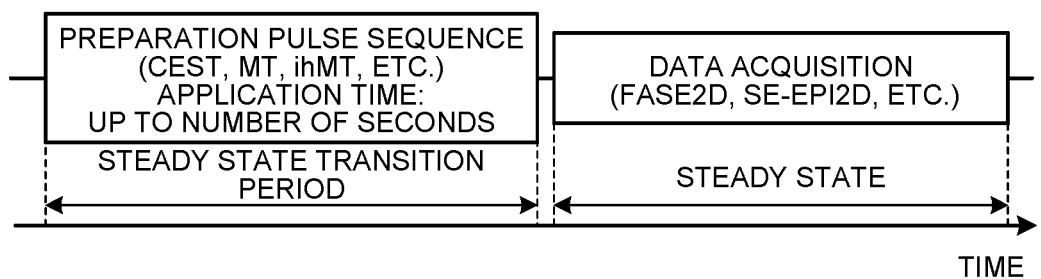
FIG. 2 is a diagram illustrating an example of an MT imaging method presented as a comparison example of the embodiment.

FIG. 2 is a diagram illustrating an example of an MT imaging method presented as a comparison example. As illustrated in FIG. 2, prior to data acquisition of an MR signal, a preparation pulse sequence (containing approximately tens to hundreds of MT pulses) lasting approximately a number of seconds is applied. For example, the data acquisition is performed as a two-dimensional acquisition using a single-shot scheme. In the comparison example illustrated in FIG. 2, the data acquisition is performed in a steady state in which impacts imposed on contrast (hereinafter, "MT contrast") of the image (e.g., the MTR or ihMTR image) by the MT pulse application are steady. For example, the steady state corresponds to a time period in which temporal changes in the MT contrast caused by the MT pulse application are either constant or equal to or larger than a predetermined threshold value. In other words, the steady state corresponds to a state in which the magnitude of longitudinal magnetization related to protons in the imaged subject becomes steady due to the application of the MT pulses. For example, it is possible to set the steady state by performing a simulation based on Bloch equations using the image types and the sequence information (explained later).

Further, as illustrated in FIG. 2, the preparation pulse sequence is applied to the patient P for a number of seconds from the time when the MT pulse starts being applied to the patient P, in a transition period (hereinafter, "steady state transition period") during which a transition into the steady state is made. The steady state transition period corresponds to a non-steady state in which the MT contrast temporally fluctuates due to the application of the MT pulses. In other words, the steady state transition period corresponds to a time period in which the magnitude of the longitudinal magnetization related to the protons in the imaged subject is in a fluctuating (non-steady) state (i.e., the non-steady state) due to the application of the MT pulses. In other words, in the comparison example, the preparation pulse sequence made up of the plurality of MT pulses is at first applied to the patient P, so that the data acquisition is performed in the steady state.

Figure 3:
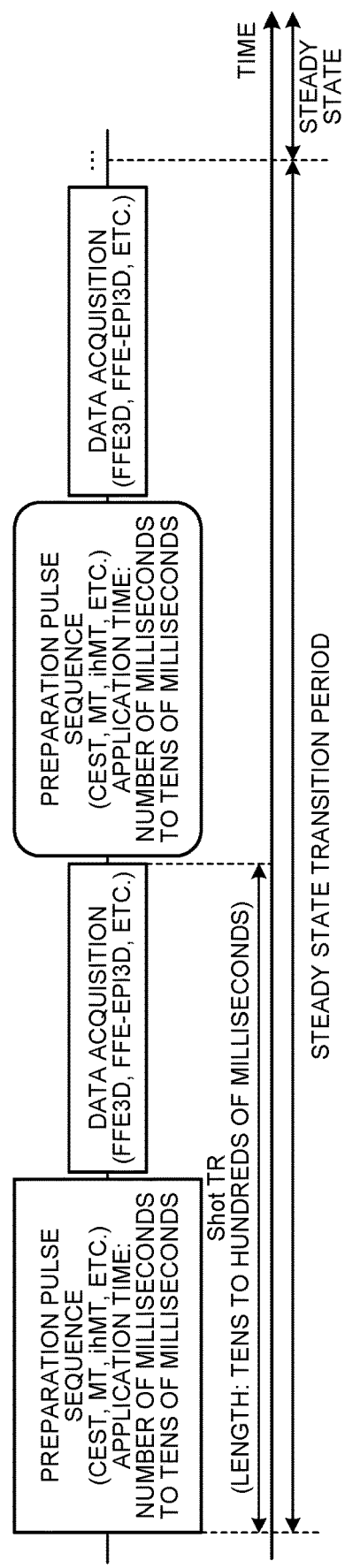
FIG. 3 is a diagram illustrating an example of an MT imaging method according to the embodiment.

FIG. 3 is a diagram illustrating an example of the MT imaging method according to the present embodiment. The scale of the time axis in FIG. 3 is shorter than the scale of the time axis in FIG. 2. As illustrated in FIG. 3, under control of the sequence controlling circuitry 120 based on the sequence information corresponding to the MT imaging method, a preparation pulse sequence (containing one to tens of MT pulses, approximately) lasting approximately tens to hundreds of milliseconds is applied to the patient P, prior to the data acquisition of the MR signal. After that, the data acquisition is performed as a three-dimensional acquisition using a multi-shot scheme, for example. Alternatively, the data acquisition may be a two-dimensional acquisition. In the following sections, to explain a specific example, it is assumed that the data acquisition according to the MT imaging method is performed three-dimensionally.

As illustrated in FIG. 3, according to the MT imaging method, while using short TR during the steady state transition period, a preparation pulse sequence containing fewer MT pulses than those in the comparison example is applied to the patient P, so as to acquire an MR signal (hereinafter, "first MR signal") with respect to a radio frequency region in the k-space. More specifically, as illustrated in FIG. 3, during the steady state transition period, the application of the preparation pulse sequence and the acquisition of the first MR signal with respect to the radio frequency region are repeatedly performed. The radio frequency region is a frequency region in which impacts on the MT contrast are smaller than those in a low frequency region.

Subsequently, according to the MT imaging method, in the steady state, a preparation pulse sequence containing fewer MT pulses than those in the comparison example is applied to the patient P, so as to acquire an MR signal (hereinafter, "second MR signal") with respect to the low frequency region in the k-space. More specifically, in the steady state, the application of the preparation pulse sequence and the acquisition of the second MR signal with respect to the low frequency region are repeatedly performed. The low frequency region is a frequency region in which impacts on the MT contrast are larger than those in the radio frequency region. For this reason, according to the MT imaging method, the MT contrast of an image (e.g., an MTR image or an ihMTR image) obtained by applying the MT pulses is ensured similarly to that in the comparison example. In addition, when the MT imaging method is used, it is possible to shorten the imaging time period compared to that in the comparison example.

The low frequency region is a frequency region within the k-space where, for example, a contribution to the contrast of the MR image is dominant. In other words, the low frequency region is a part of the k-space that includes at least the center of the k-space, for example. On the contrary, the radio frequency region is a frequency region within the k-space where, for example, a contribution to the contour in the MR image is dominant. In other words, the radio frequency region is a part of the k-space that does not include the low frequency region, for example.

Figure 4:
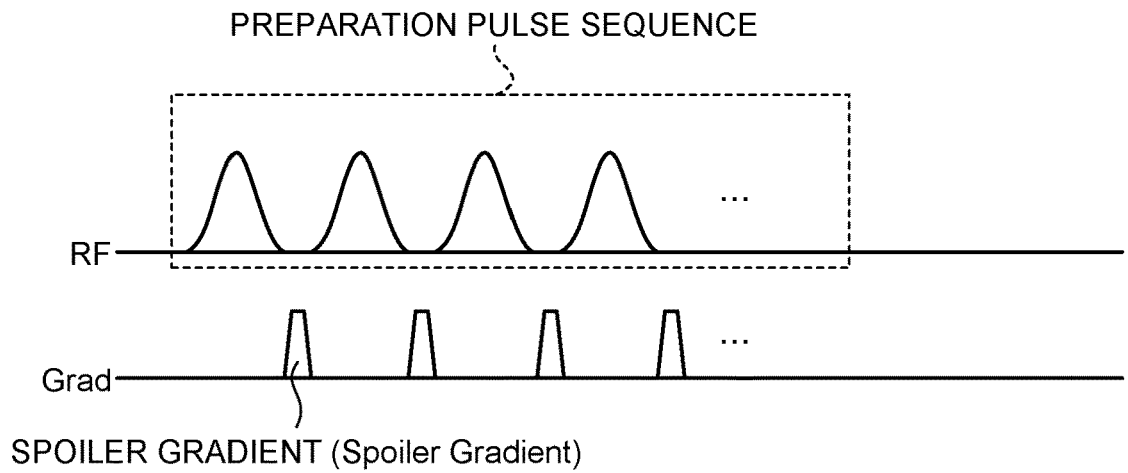
FIG. 4 is a chart illustrating an example of a preparation pulse sequence in the MT imaging method according to the embodiment.

FIG. 4 is a chart illustrating an example of the preparation pulse sequence according to the MT imaging method. As illustrated in FIG. 4, after applying each of the plurality of MT pulses in the preparation pulse sequence, a spoiler gradient is applied to the patient P, for example.

Figure 5:
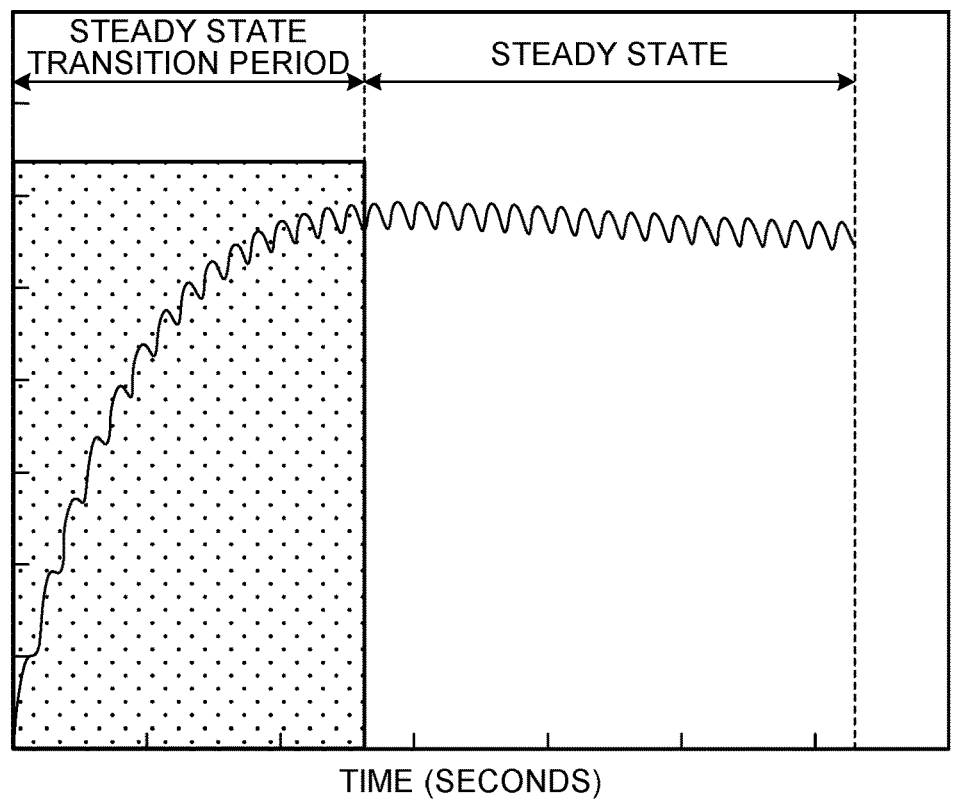
FIG. 5 is a chart illustrating an example of changes in MT contrast with respect to an imaging time period, in the MT imaging method according to the embodiment.

FIG. 5 is a chart illustrating an example of changes in the MT contrast (e.g., an ihMT Ratio (an ihMTR)) with respect to an imaging time period, according to the MT imaging method. As illustrated in FIG. 5, due to the application of the preparation pulse sequence according to the MT imaging method, the MT contrast rises. On the contrary, during the data acquisition, the MT contrast decreases. As illustrated in FIG. 5, during the steady state transition period (the non-steady state), the MT contrast decreases at the time of acquiring the first MR signal and rises at the time of applying the preparation pulse sequence in an amount larger than the decrease in the MT contrast caused by the acquisition of the first MR signal. As a result, during the steady state transition period, the MT contrast rises to the value of the MT contrast in the steady state. Further, as illustrated in FIG. 5, in the steady state, the MT contrast decreases at the time of acquiring the second MR signal and rises at the time of applying the preparation pulse sequence in an amount equal to the decrease in the MT contrast caused by the acquisition of the second MR signal. As a result, at the time of acquiring the second MR signal in the steady state, the MT contrast is substantially constant, as illustrated in FIG. 5.

Figure 6:
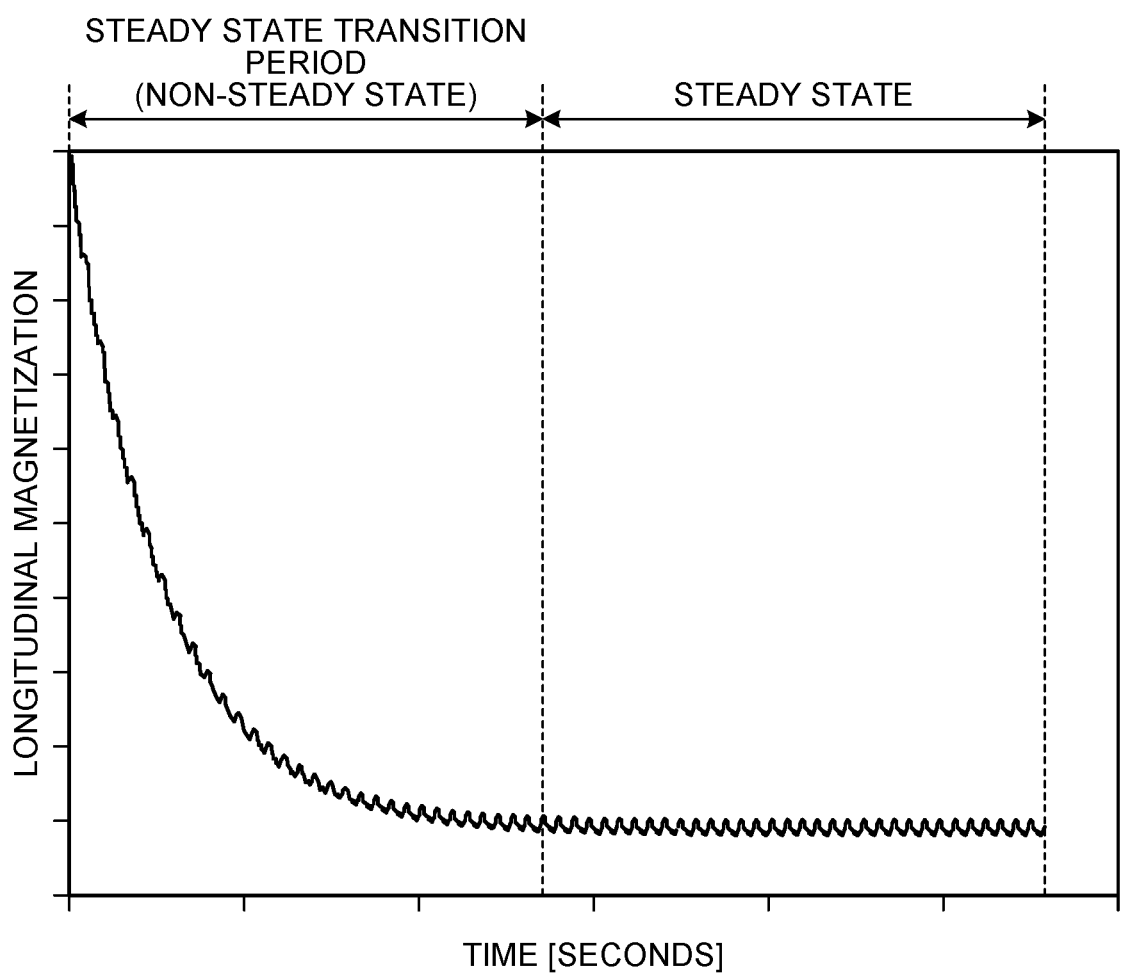
FIG. 6 is a chart illustrating an example of changes in longitudinal magnetization with respect to an imaging time period, in the MT imaging method according to the embodiment.

FIG. 6 is a chart illustrating an example of changes in the longitudinal magnetization with respect to an imaging time period, according to the MT imaging method. As illustrated in FIG. 6, due to the application of the preparation pulse sequence according to the MT imaging method, the longitudinal magnetization decreases. In contrast, at the time of acquiring the data, the longitudinal magnetization increases. As illustrated in FIG. 6, during the steady state transition period (the non-steady state), the longitudinal magnetization increases at the time of acquiring the first MR signal and decreases at the time of applying the preparation pulse sequence in an amount larger than the increase in the longitudinal magnetization caused by the acquisition of the first MR signal. As a result, during the steady state transition period, the longitudinal magnetization decreases down to the value of the longitudinal magnetization in the steady state. Further, as illustrated in FIG. 6, in the steady state, the longitudinal magnetization increases at the time of acquiring the second MR signal and decreases at the time of applying the preparation pulse sequence in an amount equal to the increase in the longitudinal magnetization caused by the acquisition of the second MR signal. As a result, at the time of acquiring the second MR signal in the steady state, the longitudinal magnetization is substantially constant, as illustrated in FIG. 6. As illustrated in FIG. 6, the steady state transition period corresponds to a transition period until the magnetization transitions into the steady state.

As explained with reference to FIGS. 3 to 6, the MT imaging method according to the present embodiment includes the first pulse sequence in which the application of at least one MT pulse and the acquisition of the first MR signal corresponding to one of the radio frequency regions in the k-space are repeated in the transition period, whereas the application of at least one MT pulse and the acquisition of the second MR signal corresponding to the low frequency region in the k-space are repeated in the steady state. In other words, in the first pulse sequence, the application of the first MT pulse and the acquisition of the first MR signal corresponding to the radio frequency region in the part of the k-space are repeated in the transition period until the magnetization transitions into the steady state, whereas the application of the first MT pulse and the acquisition of the second MR signal corresponding to the low frequency region in the k-space are repeated in the steady state.

In addition, the MT imaging method according to the present embodiment further includes the second pulse sequence. In the second pulse sequence, the MR signal is acquired by performing a similar procedure to that in the first pulse sequence, while using the MT pulse different from the MT pulse in the first pulse sequence. More specifically, in the second pulse sequence, the application of the second MT pulse different from the first MT pulse and the acquisition of the third MR signal corresponding the radio frequency region are repeated in the transition period, whereas the application of the second MT pulse and the acquisition of the fourth MR signal corresponding to the low frequency region are repeated in the steady state.

As for a difference between the MT pulses, for example, when the sequence is for an imaging process related to the CEST effect, the difference lies in offset values (deviations from the resonance frequency [0 ppm] of free water caused by the static magnetic field) for the frequencies of the MT pulses. In contrast, as for a difference between the MT pulses, for example, when the sequence is for an imaging process related to the ihMT method, the difference lies in changes in the polarity (+/−) of the frequency (offset values) using the resonance frequency (0 ppm) of free water caused by the static magnetic field as a reference, in the preparation pulse sequence (the sequence of the MT pulses). The differences in the MT pulses are caused by the fact that the substances serving as a target for the MT images are different.

Further, the MT imaging method according to the present embodiment is not limited to including the first pulse sequence and the second pulse sequence and may include a plurality of pulse sequences corresponding to image types realized by applying mutually-different MT pulses. The radio frequency region has, in the k-space, a radio frequency band related to at least one selected from between a phase encoding direction and a slice encoding direction. In the following sections, to explain a specific example, it is assumed that the radio frequency region has, in the k-space, a radio frequency band related to the slice encoding direction.

By employing the assigning function 134, the processing circuitry 150 is configured to assign the third MR signal corresponding to one of the radio frequency regions in the k-space and having been acquired by executing the second pulse sequence, to the other radio frequency region in the k-space related to the first pulse sequence. In other words, the assigning function 134 is configured to assign the third MR signal to the radio frequency region in the other part of the k-space related to the first pulse sequence. As a result, the process of filling the k-space (hereinafter, "first k-space") corresponding to the first pulse sequence with the MR signal (which may more specifically be referred to as MR data or k-space data) is completed. More specifically, in the first k-space, the assigning function 134 is configured to assign the first MR signal to the one of the radio frequency regions, to further assign the second MR signal to the low frequency region, and to assign the third MR signal to the other radio frequency region. The processing circuitry 150 realizing the assigning function 134 corresponds to an assigning unit.

When the MT imaging method according to the present embodiment includes a plurality of pulse sequences, for example, the assigning function 134 is configured, with respect to pulse sequences that are chronologically adjacent to each other, to assign the MR signal corresponding to one of the radio frequency regions and having been acquired by using the chronologically later pulse sequence, to the other radio frequency region in another k-space (hereinafter, "earlier k-space") corresponding to the chronologically earlier pulse sequence. Further, the assigning function 134 is configured, with respect to the pulse sequences that are chronologically adjacent to each other, to assign the MR signal corresponding to the one of the radio frequency regions and having been acquired by using the chronologically earlier pulse sequence to the one of the radio frequency regions in the earlier k-space and to assign the MR signal corresponding to the low frequency region and having been acquired by using the chronologically earlier pulse sequence to the one of the radio frequency regions in the earlier k-space.

Figure 7:
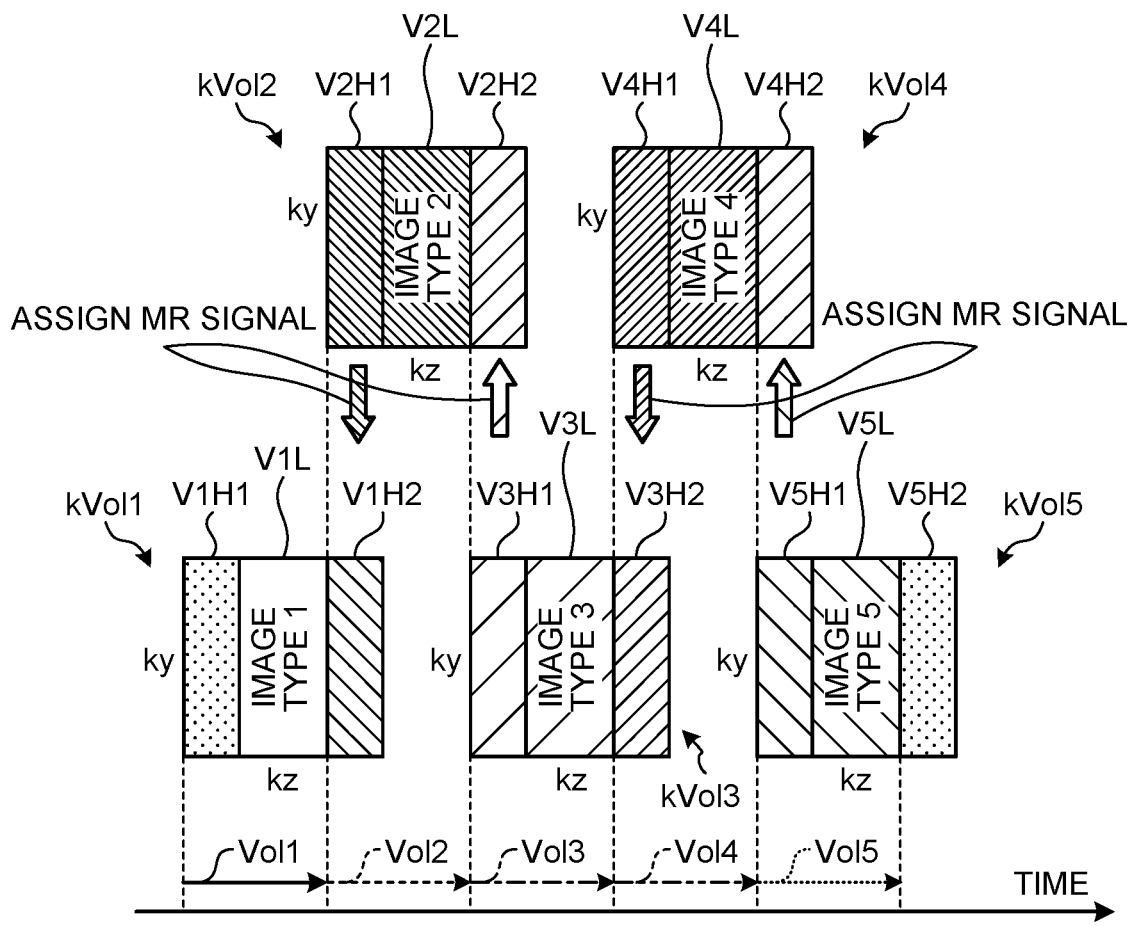
FIG. 7 is a chart illustrating an example of an outline of a process performed by an assigning function according to the embodiment, in a situation where five image types are yielded by applying MT pulses.

FIG. 7 is a chart illustrating an example of an outline of a process performed by the assigning function 134, in a situation where five image types are yielded by applying the MT pulses, i.e., in a situation where the MT imaging method according to the present embodiment includes five types of pulse sequences. On the time axis in FIG. 7, the arrows labeled as "Vol1" to "Vol5" indicate the imaging time periods of the imaging volumes corresponding to image types 1 to 5. In FIG. 7, the arrows indicating assignment of the MR signals each indicate that an MR signal (k-space data) corresponding to one of the radio frequency regions at the arrow start point is assigned to the other radio frequency region at the arrow end point, so that at least a part of the k-space data is shared. The sharing of the k-space data may be referred to as view sharing.

As illustrated in FIG. 7, the sequence controlling circuitry 120 is configured to execute a first pulse sequence on a volume Vol1 corresponding to image type 1. As a result, a first MR signal corresponding to one of the radio frequency regions, V1H1, in a first k-space kVol1 related to the volume Vol1 and a second MR signal corresponding to a low frequency region V1L in the first k-space kVol1 are acquired. Subsequently, the sequence controlling circuitry 120 is configured to execute a second pulse sequence on a volume Vol2 corresponding to image type 2. As a result, a third MR signal corresponding to one of the radio frequency regions, V2H1, in a k-space (hereinafter, "second k-space") kVol2 related to the volume Vol2 and a fourth MR signal corresponding to a low frequency region V2L in the second k-space kVol2 are acquired. In this situation, in the first k-space kVol1, the assigning function 134 is configured to assign the first MR signal to the one of the radio frequency regions V1H1, to further assign the second MR signal to the low frequency region V1L, and to assign the third MR signal to the other radio frequency region V1H2. As a result, the process of filling the first k-space kVol1 with the MR data is completed.

After executing the second pulse sequence, the sequence controlling circuitry 120 is configured to execute a third pulse sequence on a volume Vol3 corresponding to image type 3. As a result, a fifth MR signal corresponding to one of the radio frequency regions, V3H1, in a k-space (hereinafter, "third k-space") kVol3 related to the volume Vol3 and a sixth MR signal corresponding to a low frequency region V3L in the third k-space kVol3 are acquired. In this situation, in the second k-space kVol2, the assigning function 134 is configured to assign the third MR signal to the one of the radio frequency regions V2H1, to further assign the fourth MR signal to the low frequency region V2L, and to assign the fifth MR signal to the other radio frequency region V2H2. As a result, the process of filling the second k-space kVol2 with the MR data is completed.

After executing the third pulse sequence, the sequence controlling circuitry 120 is configured to execute a fourth pulse sequence on a volume Vol4 corresponding to image type 4. As a result, a seventh MR signal corresponding to one of the radio frequency regions, V4H1, in a k-space (hereinafter, "fourth k-space") kVol4 related to the volume Vol4 and an eighth MR signal corresponding to a low frequency region V4L in the fourth k-space kVol4 are acquired. In this situation, in the third k-space kVol3, the assigning function 134 is configured to assign the fifth MR signal to the one of the radio frequency regions V3H1, to further assign the sixth MR signal to the low frequency region V3L, and to assign the seventh MR signal to the other radio frequency region V3H2. As a result, the process of filling the third k-space kVol3 with the MR data is completed.

After executing the fourth pulse sequence, the sequence controlling circuitry 120 is configured to execute a fifth pulse sequence on a volume Vol5 corresponding to image type 5. As a result, a ninth MR signal corresponding to one of the radio frequency regions, V5H1, in a k-space (hereinafter, "fifth k-space") kVol5 related to the volume Vol5 and a tenth MR signal corresponding to a low frequency region V4L in the fifth k-space kVol5 are acquired. In this situation, in the fourth k-space, the assigning function 134 is configured to assign the seventh MR signal to the one of the radio frequency regions V4H1, to further assign the eighth MR signal to the low frequency region V4L, and to assign the ninth MR signal to the other radio frequency region V4H2. As a result, the process of filling the fourth k-space with the MR data is completed.

In addition, in the fifth k-space, the assigning function 134 is configured to assign the ninth MR signal to the one of the radio frequency regions V5H1, to further assign the tenth MR signal to a low frequency region V5L, and to assign the first MR signal to the other radio frequency region V5H2. As a result, the process of filling the fifth k-space kVol5 with the MR data is completed. In other words, the other radio frequency region in the k-space related to the pulse sequence that was the last to be executed in the MT imaging method according to the present embodiment is filled with the MR signal corresponding to the one of the radio frequency regions in the k-space related to the pulse sequence that was the first to be executed in the MT imaging method. Further, in the fifth sequence, when the MR signal related to the other radio frequency region V5H2 is acquired, the assigning function 134 fills the fifth k-space kVol5 with MR data, on the basis of the MR signal acquired by using the fifth sequence. In other words, in the pulse sequence that is the last to be executed in the MT imaging method according to the present embodiment, the MR signal corresponding to the entire k-space may be acquired.

As illustrated in FIG. 7, the imaging period for the radio frequency region V1H1 related to image type 1, the imaging period for the radio frequency region V2H1 related to image type 2, the imaging period for the radio frequency region V3H1 related to image type 3, the imaging period for the radio frequency region V4H1 related to image type 4, and the imaging period for the radio frequency region V1H1 related to image type 5 correspond to the steady state transition period. In contrast, as illustrated in FIG. 7, the imaging period for the low frequency region V1L related to image type 1, the imaging period for the low frequency region V2L related to image type 2, the imaging period for the low frequency region V3L related to image type 3, the imaging period for the low frequency region V4L related to image type 4, and the imaging period for the low frequency region V5L related to image type 5 correspond to the steady state.

As illustrated in FIG. 7, after the imaging process related to the low frequency region V1L, the imaging process for the radio frequency region V2H1 is performed. After the imaging process related to the low frequency region V2L, the imaging process for the radio frequency region V3H1 is performed. After the imaging process related to the low frequency region V3L, the imaging process for the radio frequency region V4H1 is performed. After the imaging process related to the low frequency region V4L, the imaging process for the radio frequency region V5H1 is performed. The imaging processes are performed in the sequential order described above because the substances targeted by the MT pulses are different among the MT images corresponding to the different image types. In other words, even when the longitudinal magnetization has not sufficiently recovered after an imaging process related to a low frequency region, because the targeted substance is different for each of the image types, the MT pulse is different for each of the image types. It is therefore possible to realize the sequential order of the imaging processes as described above.

By employing the image generating function 136, the processing circuitry 150 is configured to generate an MR image corresponding to the first pulse sequence on the basis of the first MR signal, the second MR signal, and the third MR signal. For example, on the basis of the MR data filling the first k-space kVol1, the image generating function 136 is configured to generate a map image (hereinafter, "MT map image") indicating the MT effect, with respect to the volume Vol1 corresponding to image type 1. Because any of the known methods can be used for generating the MT map image, the explanations thereof will be omitted.

By employing the image generating function 136, the processing circuitry 150 is configured to generate an MT map image related to the volume Vol2 corresponding to image type 2, on the basis of the MR data filling the second k-space kVol2. The image generating function 136 is configured to generate an MT map image related to the volume Vol3 corresponding to image type 3, on the basis of the MR data filling the third k-space kVol3. The image generating function 136 is configured to generate an MT map image related to the volume Vol4 corresponding to image type 4, on the basis of the MR data filling the fourth k-space kVol4. The image generating function 136 is configured to generate an MT map image related to the volume Vol5 corresponding to image type 5, on the basis of the MR data filling the fifth k-space kVol5.

An overall configuration of the MRI apparatus 100 according to the embodiment has thus been explained. The MRI apparatus 100 according to the embodiment structured as described above is configured, as illustrated in FIG. 7, to perform a process (hereinafter, "MT map generating process") of generating the MT map images while taking an imaging time period shorter than that in the comparison example. The MT map generating process is the process of generating the MT map images, as a result of the sequence controlling circuitry 120 implementing the MT imaging method including the plurality of sequences, and the assigning function 134 assigning the MR signals in the steady state transition period.

Figure 8:
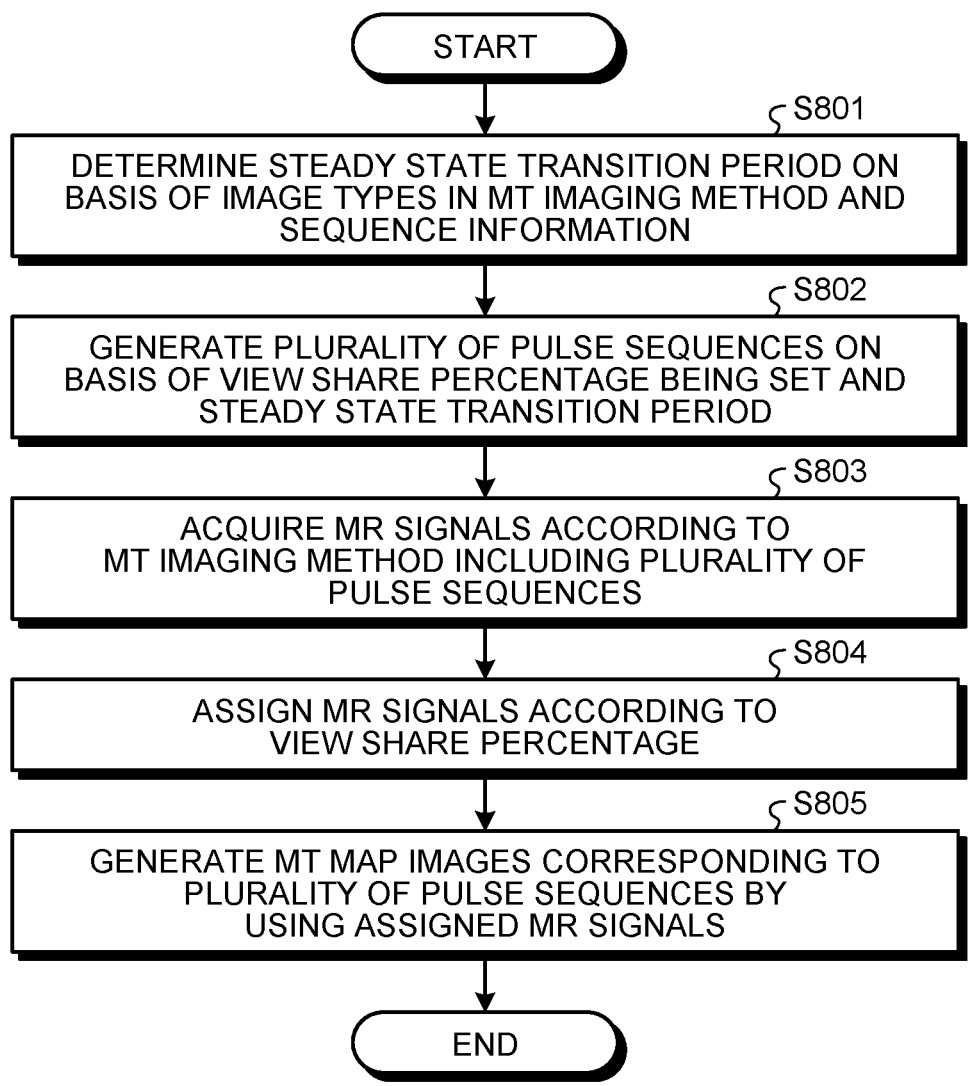
FIG. 8 is a flowchart illustrating an example of a procedure in an MT map generating process according to the embodiment.

In the following sections, a procedure in the MT map generating process will be explained, with reference to FIG. 8. FIG. 8 is a flowchart illustrating an example of the procedure in the MT map generating process. To simplify the explanation, it is assumed that the MT imaging method according to the present embodiment includes, as illustrated in FIG. 7, the first to the fifth pulse sequences.

An MT Map Generating Process

Step S801:

By employing the controlling function 133, the processing circuitry 150 determines a steady state transition period on the basis of the image types in the MT imaging method and the sequence information. For example, when the user inputs image types of MT map images and sequence information corresponding to the image types via the input apparatus 141, the controlling function 133 determines the steady state transition period by performing a simulation based on Bloch equations using the image types and the sequence information.

Step S802:

By employing the controlling function 133, the processing circuitry 150 generates the plurality of pulse sequences (the first to the fifth pulse sequences) in the MT imaging method, on the basis of the view share percentage set by the user via the input apparatus 141 and the determined steady state transition period. The view share percentage corresponds to the ratio of the other radio frequency region to the k-space, i.e., the ratio (a share ratio) of the k-space data shared with the one of the radio frequency regions of another image type to the entire k-space data. Alternatively, for example, the view share percentage may be expressed as a ratio of the imaging time period for the one of the radio frequency regions of another image type, to the entire data acquisition time period in the k-space. The controlling function 133 sequentially outputs the generated plurality of pulse sequences to the sequence controlling circuitry 120. Alternatively, the processes at steps S801 and S802 may be realized by, for example, a sequence setting function different from the controlling function 133. The processing circuitry 150 realizing the sequence setting function corresponds to a sequence setting unit.

Step S803:

The sequence controlling circuitry 120 acquires MR signals according to the MT imaging method including the plurality of pulse sequences. In other words, as illustrated in FIG. 7 for example, the sequence controlling circuitry 120 sequentially executes the plurality of pulse sequences. As a result, the sequence controlling circuitry 120 acquires the first to the tenth MR signals, as illustrated in FIG. 7, for example.

Step S804:

By employing the assigning function 134, the processing circuitry 150 assigns the MR signals to the k-space according to the view share percentage. For example, when the plurality of sequences in the MT imaging method correspond to n types (where n is a natural of 2 or larger), in the (n−1)-th k-space, the assigning function 134 assigns the MR signal acquired with respect to one of the radio frequency regions in the (n−1)-th k-space by using the (n−1)-th pulse sequence to the one of the radio frequency regions, assigns the MR signal acquired with respect to the low frequency region in the (n−1)-th k-space by using the (n−1)-th pulse sequence to the low frequency region, and assigns the MR signal acquired with respect to one of the radio frequency regions in the (n)-th k-space by using the (n)-th pulse sequence to the other radio frequency region.

Step S805:

By employing the image generating function 136, the processing circuitry 150 generates MT map images corresponding to the plurality of pulse sequences, on the basis of the assigned MR signals. In this situation, the image generating function 136 may generate an MT map image on the basis of the data of a k-space filled with MR data, as being triggered by completion of the process of filling the k-space with the MR data. For instance, in the example illustrated in FIG. 7, while the third sequence is being executed, the image generating function 136 generates an MT map image corresponding to the first sequence, on the basis of the MR data filling the first k-space kVol1. Further, while the fourth sequence is being executed, the image generating function 136 generates an MT map image corresponding to the second sequence, on the basis of the MR data filling the second k-space kVol2. Also, while the fifth sequence is being executed, the image generating function 136 generates an MT map image corresponding to the third sequence, on the basis of the MR data filling the third k-space kVol3.

The MRI apparatus 100 according to the embodiment described above is configured to execute: the first pulse sequence in which the application of the first MT pulse and the acquisition of the first MR signal corresponding to the radio frequency region in the part of the k-space are repeated in the transition period until the magnetization transitions into the steady state, whereas the application of the first MT pulse and the acquisition of the second MR signal corresponding to the low frequency region in the k-space are repeated in the steady state; and the second pulse sequence in which the application of the second MT pulse different from the first MT pulse and the acquisition of the third MR signal corresponding to the radio frequency region are repeated in the transition period, whereas the application of the second MT pulse and the acquisition of the fourth MR signal corresponding to the low frequency region are repeated in the steady state. In addition, the MRI apparatus 100 according to the present embodiment is configured to assign the third MR signal acquired by executing the second pulse sequence to the other radio frequency region in the first k-space kVol1 and to generate the MT map image corresponding to the first pulse sequence on the basis of the first to the third MR signals.

As a result, the MRI apparatus 100 in the present example is configured to acquire the MR signals related to the one of the radio frequency regions in the steady state transition period as illustrated in FIGS. 5 and 6 and is able to omit the acquisition of the MR signals corresponding to the other radio frequency region which has an extremely low impact on the image contrast, as illustrated in FIG. 7. It is therefore possible to improve efficiency and shorten the imaging time period related to the plurality of image types based on the MT effect or the CES effect, while maintaining the contrast of the MT map images. Consequently, by using the MRI apparatus 100 according to the present embodiment, it is possible to enhance the throughput of a medical examination requiring a plurality of image types based on the MT effect or the CEST effect. It is therefore possible to reduce burdens on the patient P related to the imaging time period of such a medical examination.

First Application Example

Figure 9:
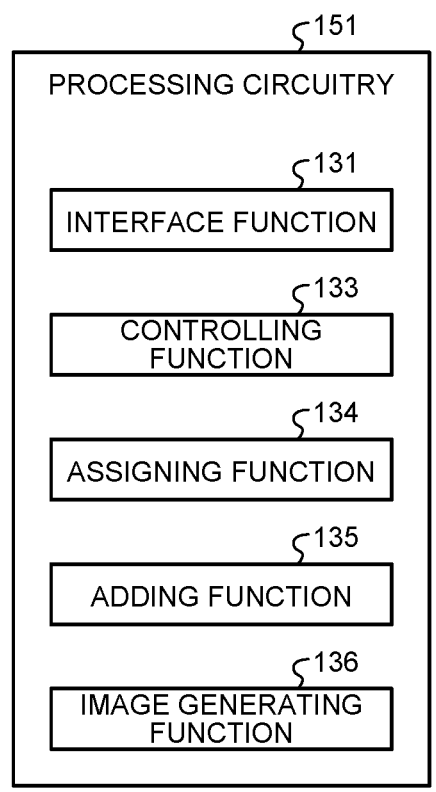
FIG. 9 is a diagram illustrating an example of a plurality of functions included in processing circuitry according to a first application example of the embodiment.

In a first application example, Signal-to-Noise Ratios (SNRs) of the MT maps generated by the MT map generating process are improved by addition of the MR signals. FIG. 9 is a diagram illustrating an example of a plurality of functions included in processing circuitry 151 according to the present application example. In place of the processing circuitry 150, the processing circuitry 151 illustrated in FIG. 9 is included in the MRI apparatus 100. Some of the constituent elements of the processing circuitry 151 and the MRI apparatus 100 that are different from the constituent elements in the embodiment will be explained.

With respect to the low frequency region in the MT imaging method, the sequence controlling circuitry 120 is configured to acquire an MR signal multiple times in accordance with an addition number of times set in advance. For example, in the first pulse sequence, the sequence controlling circuitry 120 is configured to perform the acquisition of the second MR signal multiple times in accordance with the addition number of times. Further, the sequence controlling circuitry 120 is configured to execute, in accordance with the addition number of times, a plurality of pulse sequences including the second pulse sequence and having mutually-different MT pulses.

By employing an adding function 135, the processing circuitry 151 is configured to generate an addition signal related to the low frequency region (hereinafter, "low frequency addition signal"), by calculating an arithmetic mean of the plurality of MR signals related to the low frequency region from mutually the same pulse sequence. For example, the adding function 135 is configured to generate the low frequency addition signal by calculating an arithmetic mean of the second MR signals as many times as the addition number of times. Further, the adding function 135 is configured to generate an addition signal related to the radio frequency region (hereinafter, "radio frequency addition signal"), by calculating an arithmetic mean of the plurality of MR signals related to one of the radio frequency regions from mutually-different pulse sequences, as many times as the addition number of times. For example, the adding function 135 is configured to generate the radio frequency addition signal by calculating an arithmetic mean of the plurality of third MR signals from the plurality of pulse sequences, as many times as the addition number of times. The processing circuitry 151 realizing the adding function 135 corresponds to an adding unit.

By employing the assigning function 134, in the k-space corresponding to a pulse sequence, the processing circuitry 151 is configured to assign an MR signal corresponding to one of the radio frequency regions acquired by using the pulse sequence, to the one of the radio frequency regions in the k-space corresponding to the pulse sequence, to further assign the low frequency addition signal to the low frequency region, and to assign the radio frequency addition signal to the radio frequency region in the other part. As a result, the process of filling the k-space corresponding to the pulse sequence with the MR signals is completed.

By employing the image generating function 136, the processing circuitry 151 is configured to generate an MT map image corresponding to the pulse sequence on the basis of the MR data in the filled k-space. For example, the image generating function 136 is configured to generate the MR image on the basis of the first MR signal, the low frequency addition signal, and the radio frequency addition signal.

Figure 10:
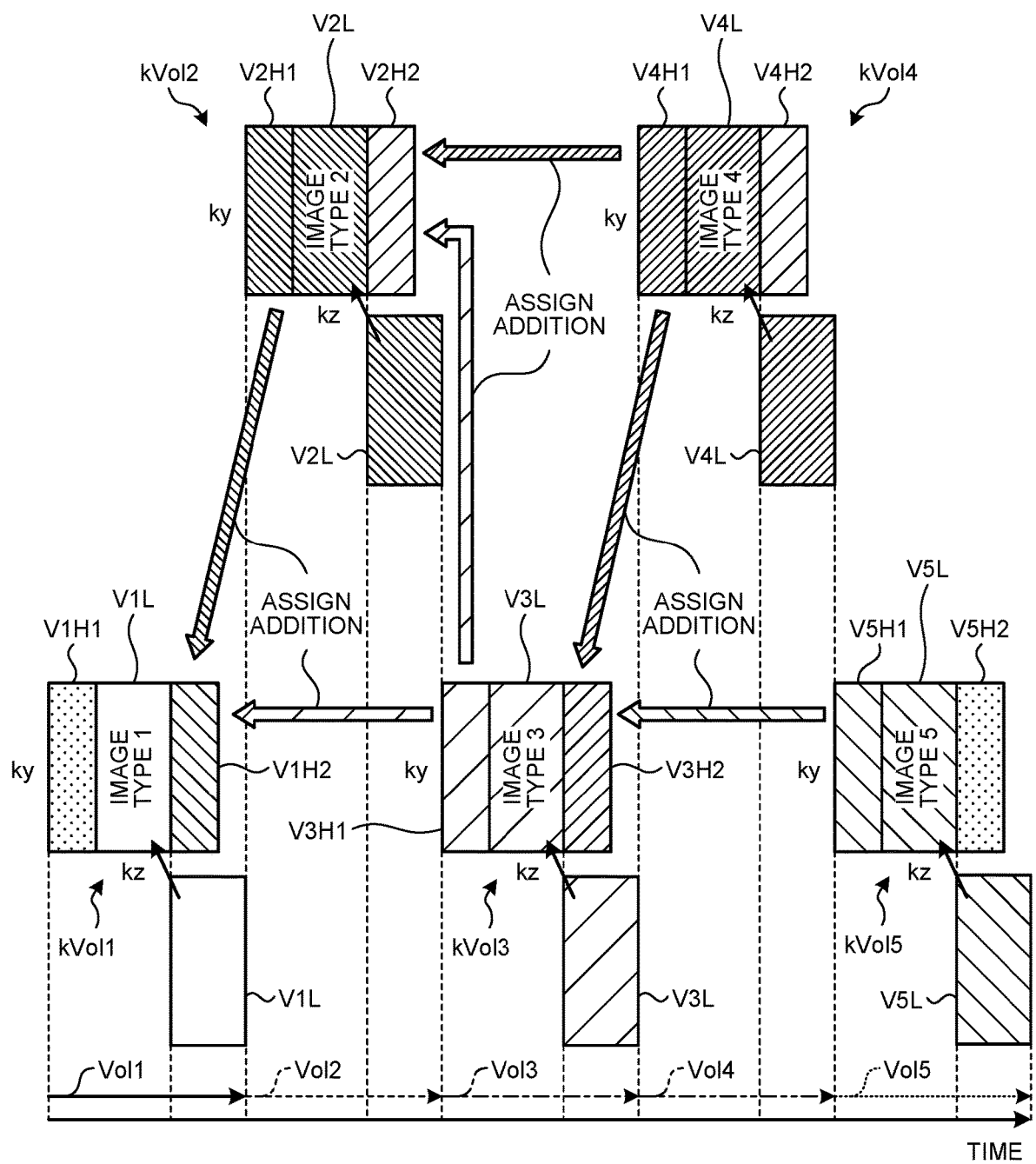
FIG. 10 is a chart illustrating an outline of a process performed by the assigning function according to the first application example of the embodiment, in a situation where five image types are yielded by applying MT pulses.

Next, an MT map generating process involving the addition assigning process will be explained, with reference to FIG. 10. FIG. 10 is a chart illustrating an outline of a process performed by the assigning function 134, in a situation where five image types are yielded by applying MT pulses, i.e., in a situation where the MT imaging method according to the present modification example includes five types of pulse sequences. On the time axis in FIG. 10, the arrows labeled as "Vol1" to "Vol5" indicate the imaging time periods of the imaging volumes corresponding to image types 1 to 5. In FIG. 10, the arrows indicating assignment of the MR signals correspond to sharing of the k-space data (view sharing). In the following sections, processes in FIG. 10 that are different from those explained with reference to FIG. 7 will be explained. Further, to explain a specific example, it is assumed that the addition number of times is 2. However, the addition number of times is not limited to 2 and may arbitrarily be set to any natural number equal to or larger than 2.

As illustrated in FIG. 10, in the first pulse sequence, the sequence controlling circuitry 120 is configured to perform the acquisition of the second MR signal multiple times in accordance with the addition number of times. In other words, in the first pulse sequence, the sequence controlling circuitry 120 is configured to perform the acquisition of the second MR signal twice. As illustrated in FIG. 10, the acquisition of the second MR signal for the second time is performed immediately after the acquisition of the second MR signal for the first time, which is in the steady state.

The sequence controlling circuitry 120 is configured to execute, in accordance with the addition number of times, a plurality of pulse sequences having mutually-different MT pulses in the first pulse sequence and including the second pulse sequence. When the addition number of times is 2, the sequence controlling circuitry 120 needs to execute at least the second pulse sequence. In the example in FIG. 10, because there are five image types, the addition number of times can be set up to 4.

As illustrated in FIG. 10, with respect to the low frequency region V2L, the sequence controlling circuitry 120 is configured to perform the acquisition of the fourth MR signal twice. With respect to the low frequency region V3L, the sequence controlling circuitry 120 is configured to perform the acquisition of the sixth MR signal twice. With respect to the low frequency region V4L, the sequence controlling circuitry 120 is configured to perform the acquisition of the eighth MR signal twice. With respect to the low frequency region V5L, the sequence controlling circuitry 120 is configured to perform the acquisition of the tenth MR signal twice.

The adding function 135 is configured to generate the first low frequency addition signal by calculating an arithmetic mean of the second MR signals as many times as the addition number of times. In other words, the adding function 135 is configured to generate a first low frequency addition signal by calculating an arithmetic mean of the two second MR signals. The adding function 135 is configured to generate a second low frequency addition signal by calculating an arithmetic mean of the two fourth MR signals. The adding function 135 is configured to generate a third low frequency addition signal by calculating an arithmetic mean of the two sixth MR signals. The adding function 135 is configured to generate a fourth low frequency addition signal by calculating an arithmetic mean of the two eighth MR signals. The adding function 135 is configured to generate a fifth low frequency addition signal by calculating an arithmetic mean of the two tenth MR signals.

The adding function 135 is configured to generate radio frequency addition signals, by calculating an arithmetic mean of the plurality of third magnetic resonance signals from the plurality of pulse sequences, as many times as the addition number of times. More specifically, the adding function 135 is configured to generate a first radio frequency addition signal, by calculating an arithmetic mean of the third MR signal and the fifth MR signal. The adding function 135 is configured to generate a second radio frequency addition signal, by calculating an arithmetic mean of the fifth MR signal and the seventh MR signal. The adding function 135 is configured to generate a third radio frequency addition signal, by calculating an arithmetic mean of the seventh MR signal and the ninth MR signal. The adding function 135 is configured to generate a fourth radio frequency addition signal, by calculating an arithmetic mean of the ninth MR signal and the first MR signal. The adding function 135 is configured to generate a fifth radio frequency addition signal, by calculating an arithmetic mean of the first MR signal and the third MR signal.

The assigning function 134 is configured to assign the low frequency addition signal to the low frequency region in the k-space, to further assign the radio frequency addition signal to the other radio frequency region in the k-space, and to assign the MR signal related to the one of the radio frequency regions to the one of the radio frequency regions. As a result, the process of filling the k-space with the MR data is completed. More specifically, in the first k-space kVol1, the assigning function 134 is configured to assign the first MR signal to the one of the radio frequency regions V1H1, to further assign the first low frequency addition signal to the low frequency region V1L, and to assign the first radio frequency addition signal to the other radio frequency region V1H2. As a result, the process of filling the first k-space kVol1 with the MR data is completed.

Further, in the second k-space kVol2, the assigning function 134 is configured to assign the third MR signal to the one of the radio frequency regions V2H1, to further assign the second low frequency addition signal to the low frequency region V2L, and to assign the second radio frequency addition signal to the other radio frequency region V2H2. As a result, the process of filling the second k-space kVol2 with the MR data is completed. In the third k-space kVol3, the assigning function 134 is configured to assign the fifth MR signal to the one of the radio frequency regions V3H1, to further assign the third low frequency addition signal to the low frequency region V3L, and to assign the third radio frequency addition signal to the other radio frequency region V3H2. As a result, the process of filling the third k-space kVol3 with the MR data is completed.

Further, in the fourth k-space kVol4, the assigning function 134 is configured to assign the seventh MR signal to the one of the radio frequency regions V4H1, to further assign the fourth low frequency addition signal to the low frequency region V4L, and to assign the fourth radio frequency addition signal to the other radio frequency region V4H2. As a result, the process of filling the fourth k-space kVol4 with the MR data is completed. In the fifth k-space kVol5, the assigning function 134 is configured to assign the ninth MR signal to the one of the radio frequency regions V5H1, to further assign the fifth low frequency addition signal to the low frequency region V5L, and to assign the fifth radio frequency addition signal to the other radio frequency region V5H2. As a result, the process of filling the fifth k-space kVol5 with the MR data is completed.

The image generating function 136 is configured to generate MT map images on the basis of the first magnetic resonance signal, the low frequency addition signals, and the radio frequency addition signals. More specifically, the image generating function 136 is configured to generate an MT map image corresponding to the first pulse sequence on the basis of the first MR signal, the first low frequency addition signal, and the first radio frequency addition signal. Further, the image generating function 136 is configured to generate an MT map image corresponding to the second pulse sequence on the basis of the third MR signal, the second low frequency addition signal, and the second radio frequency addition signal. The image generating function 136 is configured to generate an MT map image corresponding to the third pulse sequence on the basis of the fifth MR signal, the third low frequency addition signal, and the third radio frequency addition signal. The image generating function 136 is configured to generate an MT map image corresponding to the fourth pulse sequence on the basis of the seventh MR signal, the fourth low frequency addition signal, and the fourth radio frequency addition signal. The image generating function 136 is configured to generate an MT map image corresponding to the fifth pulse sequence on the basis of the ninth MR signal, the fifth low frequency addition signal, and the fifth radio frequency addition signal.

The MRI apparatus 100 according to the first application example of the embodiment described above is configured to perform, multiple times in accordance with the addition number of times, the acquisition of the second MR signal in the first pulse sequence, to execute the plurality of pulse sequences including the second pulse sequence in accordance with the addition number of times, to generate the low frequency addition signal by calculating the arithmetic mean of the second MR signals as many times as the addition number of times, to generate the radio frequency addition signal by calculating the arithmetic mean of the plurality of third magnetic resonance signals from the plurality of pulse sequences as many times as the addition number of times, to assign the low frequency addition signal to the low frequency region in the k-space, to assign the radio frequency addition signal to the other radio frequency region in the k-space, and to generate the MT map image on the basis of the first MR signal, the low frequency addition signal, and the radio frequency addition signal.

Because the low frequency region is a region that affects the intensity of the MR signal, the present embodiment makes it possible to improve the SNR and shorten the acquisition time period (imaging time period), while maintaining the contrast in the MR image. Moreover, because the MR signal is smaller in the radio frequency region than in the low frequency region, the ratio of the noise signal to the MR signal becomes high in the radio frequency region, and thus the present can effectively reduce noise in the radio frequency region.

Consequently, by using the MRI apparatus 100 in the present example, while using the MT imaging method including the addition number of times, the MR signal related to the one of the radio frequency regions is acquired multiple times in the steady state transition period, as illustrated in FIGS. 5 and 6, whereas the acquisition of the MR signal corresponding to the other radio frequency region is omitted as illustrated in FIG. 10. It is therefore possible to improve efficiency and shorten the imaging time period related to the plurality of image types based on the MT effect or the CEST effect. It is also possible to improve the SNRs of the generated MT map images due to signal addition effects. Because the other advantageous effects are the same as those of the embodiment, the explanations thereof will be omitted.

Second Application Example

Figure 11:
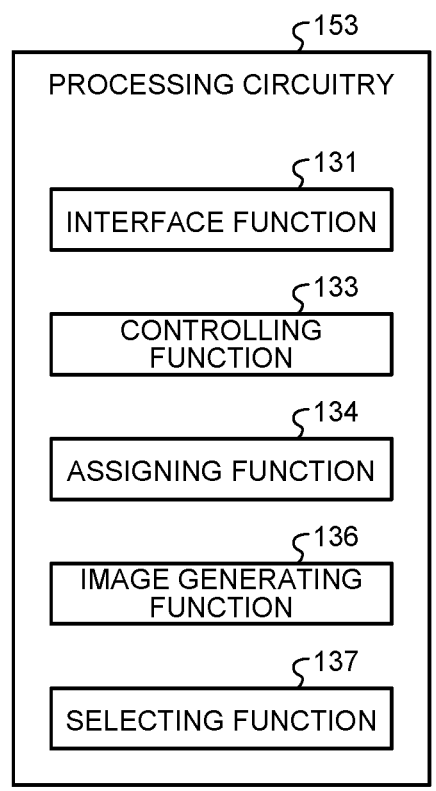
FIG. 11 is a diagram illustrating an example of a plurality of functions included in processing circuitry according to a second application example of the embodiment.

In a second application example, the assigning function 134 according to the embodiment is configured to select an MR signal to be assigned to the other radio frequency region in accordance with an image corresponding to the low frequency region. FIG. 11 is a diagram illustrating an example of a plurality of functions included in processing circuitry 153 according to the present application example. In place of the processing circuitry 151, the processing circuitry 153 illustrated in FIG. 11 is included in the MRI apparatus 100. Some of the constituent elements of the processing circuitry 153 and the MRI apparatus 100 that are different from the constituent elements in the embodiment will be explained.

The sequence controlling circuitry 120 is configured to execute a plurality of pulse sequences including the second pulse sequence and corresponding to a plurality of image types that have mutually-different MT pulses.

By employing the image generating function 136, the processing circuitry 153 is configured to generate the first low frequency image on the basis of the second MR signal. Further, the image generating function 136 is configured to generate a plurality of low frequency images corresponding to the plurality of pulse sequences, on the basis of the MR signals corresponding to the low frequency region from the plurality of pulse sequences.

By employing a selecting function 137, the processing circuitry 153 is configured to select an image type similar to that of the first low frequency image from among the plurality of low frequency images, on the basis of similarity levels between the plurality of low frequency images and the first low frequency image. More specifically, with respect to the plurality of low frequency images and the first low frequency image, the selecting function 137 is configured, while using one of two images as a reference (hereinafter, "reference image"), to calculate a similarity level of the other image (hereinafter, "comparison image") regarding the contrast of the image. For example, the similarity level is calculated by implementing a statistical calculation on a plurality of pixels in the two images. Because it is possible to apply any of known methods to the calculation of the similarity levels, the explanations thereof will be omitted. With respect to each of the plurality of low frequency images and the first low frequency image, the selecting function 137 is configured to select an image type of the low frequency image that exhibits the largest similarity level. The processing circuitry 153 realizing the selecting function 137 corresponds to a selecting unit.

By employing the assigning function 134, the processing circuitry 153 is configured to assign the third MR signal related to the selected image type to the radio frequency region in the other part of the k-space. In other words, the assigning function 134 is configured to assign the magnetic resonance signal corresponding to the one of the radio frequency regions related to the selected image type, to the other radio frequency region related to the reference image used as the reference in the selection.

Figure 12:
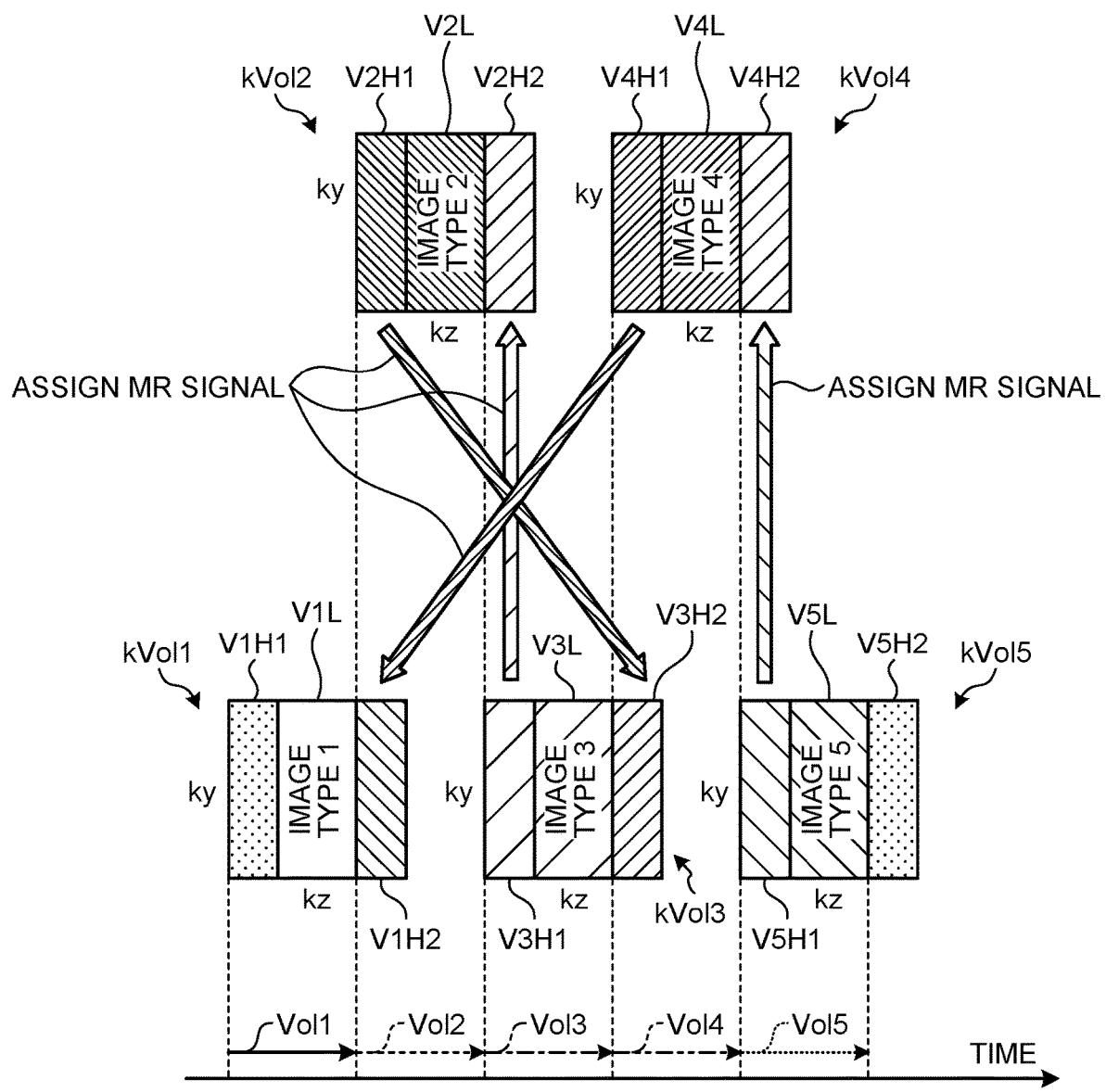
FIG. 12 is a chart illustrating an outline of a process performed by the assigning function according to the second application example of the embodiment, in a situation where five image types are yielded by applying MT pulses.

Next, FIG. 12 is a chart illustrating an outline of a process performed by the assigning function 134, in a situation where five image types are yielded by applying MT pulses, i.e., the MT imaging method of the present application example includes five types of pulse sequences. On the time axis in FIG. 12, the arrows labeled as "Vol1" to "Vol5" indicate the imaging time periods of the imaging volumes corresponding to image types 1 to 5. In FIG. 12, the arrows indicating assignment of the MR signals correspond to sharing of the k-space data (view sharing). In the following sections, processes in FIG. 12 that are different from those explained with reference to FIG. 7 will be explained.

By employing the image generating function 136, on the basis of the second MR signal, the processing circuitry 150 is configured to reconstruct an MR image (hereinafter, "first low frequency image") related to the low frequency region V1L in the first k-space kVol1. On the basis of the fourth MR signal, the image generating function 136 is configured to reconstruct an MR image (hereinafter, "second low frequency image") related to the low frequency region V2L in the second k-space kVol2. On the basis of the sixth MR signal, the image generating function 136 is configured to reconstruct an MR image (hereinafter, "third low frequency image") related to the low frequency region V3L in the third k-space kVol3. On the basis of the eighth MR signal, the image generating function 136 is configured to reconstruct an MR image (hereinafter, "fourth low frequency image") related to the low frequency region V4L in the fourth k-space kVol4. On the basis of the tenth MR signal, the image generating function 136 is configured to reconstruct an MR image (hereinafter, "fifth low frequency image")

related to the low frequency region V5L in the fifth k-space kVol5. The reconstruction of the first to the fifth low frequency images is realized through a Fourier transform, for example.

By employing the selecting function 137, the processing circuitry 150 is configured to calculate a plurality of similarity levels (hereinafter, "first similarity levels") regarding the first low frequency image, while using the first low frequency image as a reference image and using the second to the fifth low frequency images as comparison images. Further, the selecting function 137 is configured to calculate a plurality of similarity levels (hereinafter, "second similarity levels") regarding the second low frequency image, while using the second low frequency image as a reference image and using the first low frequency image and the third to the fifth low frequency images as comparison images. The selecting function 137 is configured to calculate a plurality of similarity levels (hereinafter, "third similarity levels") regarding the third low frequency image, while using the third low frequency image as a reference image and using the first, the second, the fourth, and the fifth low frequency images as comparison images. The selecting function 137 is configured to calculate a plurality of similarity levels (hereinafter, "fourth similarity levels") regarding the fourth low frequency image, while using the fourth low frequency image as a reference image and using the first to the third low frequency images and the fifth low frequency image as comparison images. The selecting function 137 is configured to calculate a plurality of similarity levels (hereinafter, "fifth similarity levels") regarding the fifth low frequency image, while using the fifth low frequency image as a reference image and using the first to the fourth low frequency images as comparison images.

From among the plurality of image types related to the MT imaging method of the present application example, the selecting function 137 is configured to select the image type related to a low frequency image exhibiting the highest similarity level among each of the first to the third similarity levels. In FIG. 11, the image type selected with respect to image type 1 is image type 4. In FIG. 11, the image type selected with respect to image type 2 is image type 3. In FIG. 11, the image type selected with respect to image type 3 is image type 2. In FIG. 11, the image type selected with respect to image type 4 is image type 5. Although not illustrated in FIG. 11, it is assumed that the image type selected with respect to image type 5 is image type 1.

As illustrated in FIG. 11, by employing the assigning function 134, in the first k-space kVol1, the processing circuitry 153 is configured to assign the first MR signal to the one of the radio frequency regions V1H1, to further assign the first MR signal to the low frequency region V1L, and to assign the seventh MR signal related to the fourth low frequency image to the other radio frequency region V1H2. In the second k-space kVol2, the assigning function 134 is configured to assign the third MR signal to the one of the radio frequency regions V2H1, to further assign the fourth MR signal to the low frequency region V2L, and to assign the fifth MR signal related to the third low frequency image to the other radio frequency region V2H2. In the third k-space kVol3, the assigning function 134 is configured to assign the fifth MR signal to the one of the radio frequency regions V3H1, to further assign the sixth MR signal to the low frequency region V3L, and to assign the third MR signal related to the second low frequency image to the other radio frequency region V3H2.

In the fourth k-space kVol4, the assigning function 134 is configured to assign the seventh MR signal to the one of the radio frequency regions V4H1, to further assign the eighth MR signal to the low frequency region V4L, and to assign the ninth MR signal related to the fifth low frequency image to the other radio frequency region V4H2. In the fifth k-space kVol5, the assigning function 134 is configured to assign the ninth MR signal to the one of the radio frequency regions V5H1, to further assign the tenth MR signal to the low frequency region V5L, and to assign the first MR signal related to the first low frequency image to the other radio frequency region V5H2.

Figure 13:
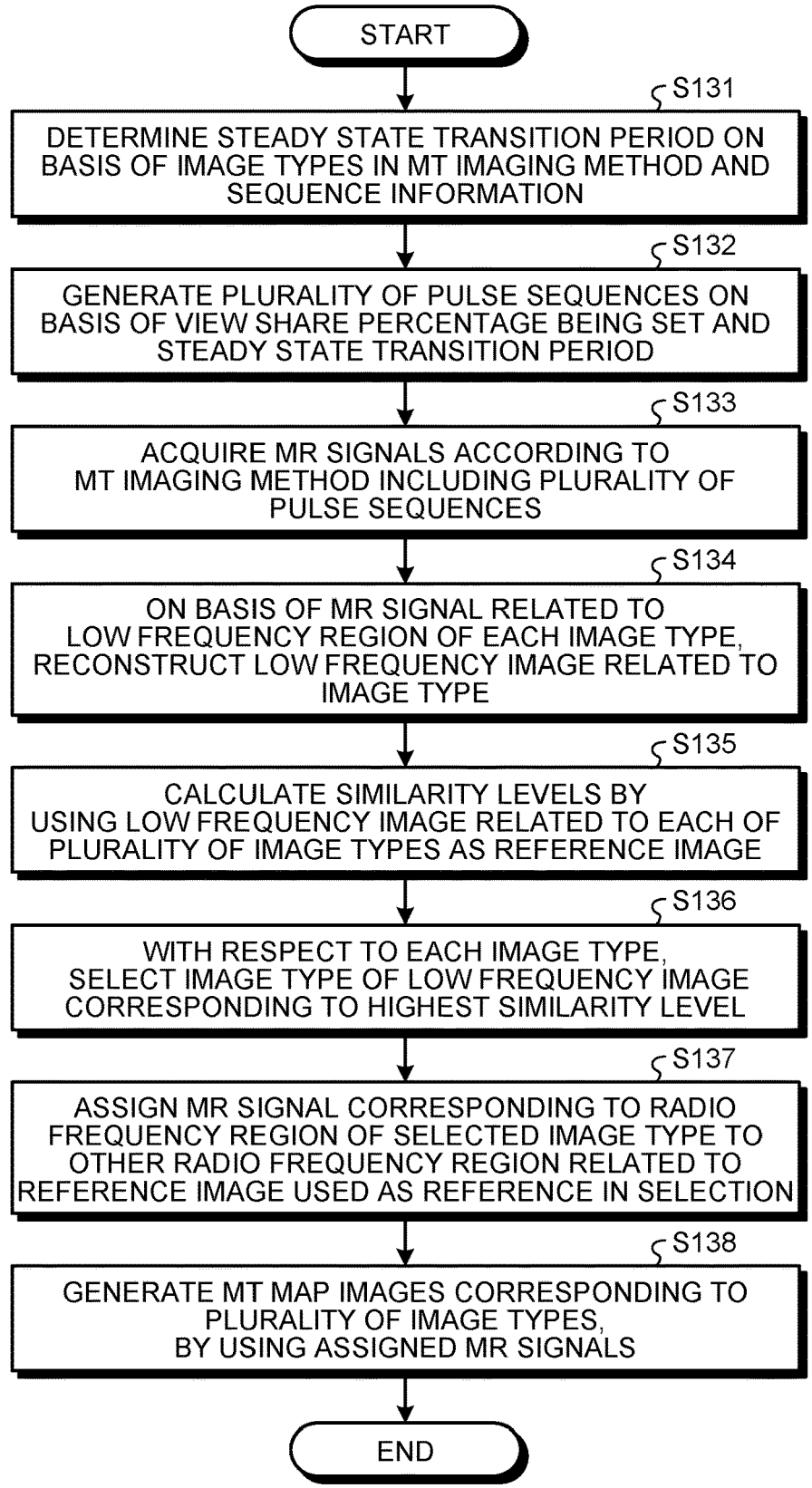
FIG. 13 is a flowchart illustrating an example of a procedure in an MT map generating process according to the second application example of the embodiment.

Next, a procedure in an MT map generating process according to the present application example will be explained, with reference to FIG. 13. FIG. 13 is a flowchart illustrating an example of the procedure in the MT map generating process. To simplify the explanation, it is assumed that the MT imaging method according to the present application example includes the first to the fifth pulse sequences, as illustrated in FIG. 12. Because steps S131, S132, and S133 in FIG. 13 correspond to steps S801, S802, and S803 in FIG. 8, respectively, the explanations thereof will be omitted.

Another MT Map Generating Process

Step S134:

By employing the image generating function 136, on the basis of the MR signals related to the low frequency region corresponding to each of the image types, the processing circuitry 153 reconstructs a low frequency image related to the image type. In other words, the image generating function 136 generates the first to the fifth low frequency images, on the basis of the MR signals corresponding to the low frequency regions.

Step S135:

By employing the selecting function 137, the processing circuitry 153 calculates similarity levels while using the low frequency image related to each of the plurality of image types as a reference image. More specifically, with respect to each of the plurality of image types, the selecting function 137 calculates the similarity levels of the other image types, while using the low frequency image in each of the plurality of image types as a reference image and using the low frequency images of the other image types as comparison images.

Step S136:

With respect to each of the image types, the selecting function 137 selects an image type of the low frequency image corresponding to the highest similarity level. More specifically, with respect to each of the plurality of image types, the selecting function 137 selects an image type related to the highest similarity level.

Step S137:

By employing the assigning function 134, the processing circuitry 153 assigns the MR signal corresponding to the radio frequency region of the selected image type to the other radio frequency region related to the reference image used as a reference in the selection. More specifically, the assigning function 134 assigns the MR signal corresponding to the one of the radio frequency regions related to the selected image type, to the other radio frequency region in the k-space related to the image type used as the reference for the selected image type. The MR signals are assigned as described at step S804 to the one of the radio frequency regions and to each of the low frequency regions in the k-space related to the image type used as the reference for the selected image type. Thus, the process of filling the k-space with the MR data is completed.

Step S138:

By employing the image generating function 136, the processing circuitry 153 generates MT map images corresponding to the plurality of image types, by using the assigned MR signals. Because the procedure for generating the MT map images is the same as that at step S805, the explanations thereof will be omitted.

The MRI apparatus 100 according to the second application example of the embodiment described above is configured to execute the plurality of pulse sequence including the second pulse sequence and corresponding to the plurality of image types that have the mutually-different MT pulses and is configured to generate the first low frequency image on the basis of the second MR signal, to generate the plurality of low frequency images corresponding to the plurality of pulse sequences, on the basis of the magnetic resonance signals corresponding to the low frequency region from the plurality of pulse sequences, to select the image type similar to the first low frequency image from among the plurality of low frequency images on the basis of the similarity levels between the plurality of low frequency images and the first low frequency image, and to assign the third MR signal related to the selected image type to the other radio frequency region in the k-space.

As a result, by using the MRI apparatus 100 in the present example, when contrast or signal intensities are extremely different among the different image types, it is possible to automatically select an image type subject to the sharing (the view sharing) of the k-space data, with the use of the similarity levels related to the images reconstructed with respect to only the low frequency regions. It is therefore possible to have the k-space data shared between certain image types having similar image contrast levels. The image type selecting process performed by the selecting function 137 corresponds to selecting an image type having the most similar MT contrast level in the steady state illustrated in FIGS. 5 and 6, for example. Consequently, according to the present application example, it is possible to reduce impacts imposed on the image contrast by the view sharing. It is therefore possible to guarantee image quality of the generated MT map images. Because the other advantageous effects are the same as those of the embodiment, the explanations thereof will be omitted.

Third Application Example

In a third application example, processes in the first application example and the second application example are combined together. For instance, the adding function 135 is configured to generate a plurality of addition signals corresponding to a plurality of pulse sequences, by adding, as many times as the addition number of times, a plurality of MR signals corresponding to a low frequency region from each of the plurality of pulse sequences corresponding to a plurality of image types. The image generating function 136 is configured to reconstruct a first low frequency image on the basis of the low frequency addition signal and to reconstruct a plurality of low frequency images corresponding to the plurality of pulse sequences on the basis of the plurality of addition signals. On the basis of similarity levels between the plurality of low frequency images and the first low frequency image, the selecting function 137 is configured to select a plurality of image types similar to the first low frequency image from among the plurality of low frequency images, in accordance with the addition number of times. Further, the adding function 135 is configured to generate a radio frequency addition signal, by adding, as many times as the addition number of times, a plurality of third magnetic resonance signals related to the selected plurality of image types. Because advantageous effects of the present application example correspond to those of the first application example and the second application example, the explanations thereof will be omitted.

Fourth Application Example

In a fourth application example, at step S801 in FIG. 8, the display 143 is configured to display a display mode (hereinafter, "input user interface") related to inputs made by the user. The display 143 is configured to display, for example, an imaged site related to the first pulse sequence, an imaging time period related to the first pulse sequence, a ratio of the steady state transition period to the imaging time period (hereinafter, "steady state transition period time ratio"), assignment setting information related to a setting for the assignment to the radio frequency region in another part of the k-space, a total imaging time period of the plurality of pulse sequences executed for the patient P by using MT pulses, and a ratio (hereinafter, "view share percentage") of the radio frequency region in the other part to the k-space.

The imaged site is, for example, a site of the patient P (e.g., the brain, a muscle, etc.) subject to a medical examination on the basis of the MT map images. The imaging time period of the plurality of pulse sequences including the first pulse sequence is set in accordance with the image types of the MT map images and the imaged site. For example, the steady state transition period time ratio is determined through a simulation on the pulse sequence being used. The steady state transition period time ratio corresponds to a ratio of the time period until the MT effect goes into the steady state in accordance with the imaged site (e.g., the brain, a muscle, etc.), to the imaging time period. For example, the assignment setting information is information for establishing one of the following settings: a setting in which pulse sequences chronologically adjacent to each other are assigned to one of the radio frequency regions as described in the embodiment; and another setting in which an image type subject to optimal view sharing is automatically selected on the basis of the similarity levels, as described in the second application example. In other words, the assignment setting information corresponds to a pattern related to the view sharing (hereinafter, "view share pattern") such as the adjacency or the automatic operation.

The total imaging time period is calculated by adding up the imaging time periods of the plurality of pulse sequences in the MT imaging method according to the present application example. When the view share percentage is 0%, the MT map generating process according to the present embodiment is turned off. The steady state transition period time ratio is, for example, displayed on the display 143 as reference information related to the process of setting a view share percentage performed by the user.

Figure 14:
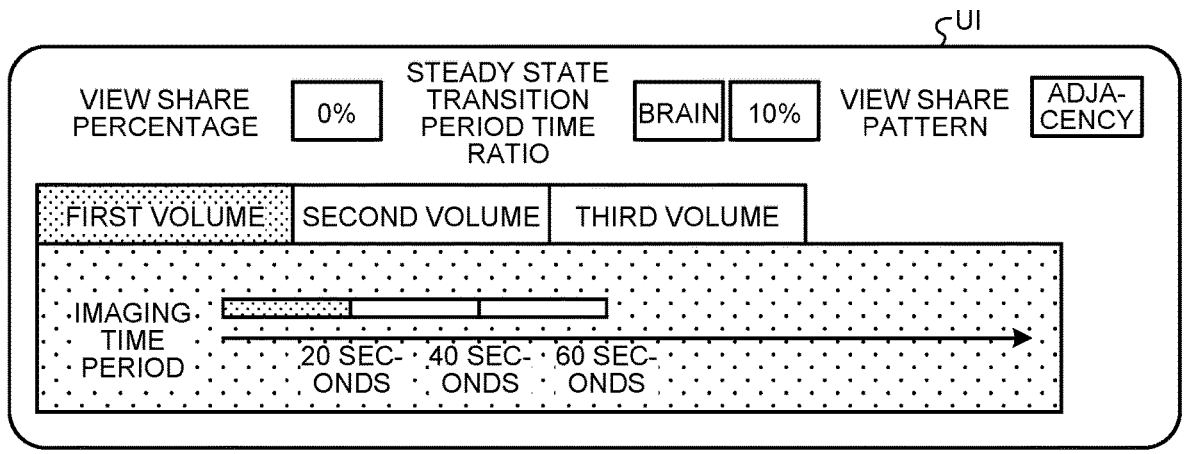
FIG. 14 is a drawing illustrating an example of an input user interface UI displayed on a display according to a fourth application example of the embodiment, in a situation where a view share percentage is 0%.

FIG. 14 is a drawing illustrating an example of an input user interface UI displayed on the display 143, in a situation where the view share percentage is 0%. As illustrated in FIG. 14, the input user interface UI is configured to display: an imaged site related to the first pulse sequence, an imaging time period related to the first pulse sequence, a steady state transition period time ratio, a view share percentage, a total imaging time period of the plurality of pulse sequences executed for the patient P by using MT pulses, and a view share pattern. Further, FIG. 14 indicates that the UI displays a total imaging time period related to the first volume and the second volume as 40 seconds and displays a total imaging time period related to the first to the third volumes as 60 seconds.

An upper limit of the ratio of the radio frequency region in the other part to the k-space is set on the basis of the ratio of the steady state transition period to the imaging time period and the first pulse sequence. More specifically, with respect to each of the plurality of pulse sequences, the upper limit is set on the basis of the ratio of the steady state transition period to the imaging time period and a corresponding one of the plurality of pulse sequences. In this situation, when the user is to set a view share percentage exceeding the upper limit, the display 143 may display, for example, a predetermined warning message indicating that the image quality may not be guaranteed. Among various types of information displayed by the display 143, the user is able to set the following items, for example: an imaged site, a view share percentage, and a view share pattern. In other words, according to an instruction from the user, the input apparatus 141 is configured to receive inputs of the imaged site, the assignment setting information, and the ratio of the radio frequency region in the other part to the k-space.

Figure 15:
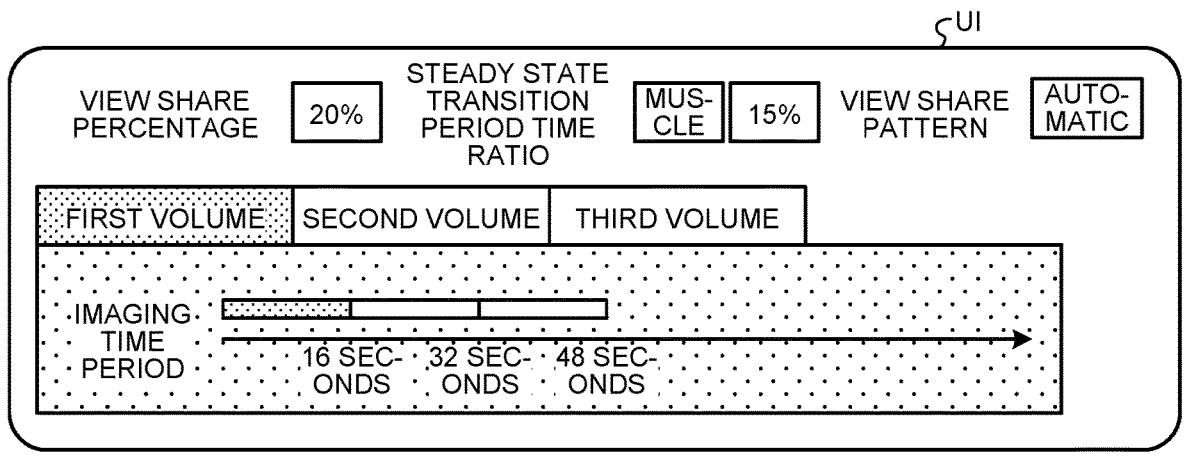
FIG. 15 is a drawing illustrating an example of the input user interface UI displayed on the display according to the fourth application example of the embodiment, in a situation where a view share percentage is 20%.

FIG. 15 is a drawing illustrating an example of the input user interface UI displayed on the display 143, in a situation where the view share percentage is 20%. Differences from FIG. 14 lie in the imaged site related to the first pulse sequence, the imaging time period related to the first pulse sequence, the steady state transition period time ratio, the view share pattern, the total imaging time period related to the first volume and the second volume, and the total imaging time period related to the first to the third volumes. In FIG. 15, the view share percentage is 20%. When the imaging time period related to the first to the third volumes in FIG. 14 are the same as that in FIG. 14, because the view share percentage is 20°, the imaging time period in FIG. 15 is indicated as 16 seconds, which is 80% of 20 seconds. The imaging time period and the like displayed on the UI in FIG. 15 may dynamically be changed and displayed, in accordance with inputs made by the user.

The MRI apparatus 100 according to the fourth application example of the embodiment described above is configured to display: the imaged site related to the first pulse sequence, the imaging time period related to the first pulse sequence, the ratio of the transition time period to the imaging time period, the assignment setting information related to the setting for the assignment to the other radio frequency region in the k-space, the total imaging time period of the plurality of pulse sequences executed for the patient P by using the MT pulses, and the ratio of the other radio frequency region to the k-space and is configured to receive the inputs of the imaged site, the assignment setting information, and the ratio of the other radio frequency region to the k-space. Further, when the MRI apparatus 100 according to the present example is used, the upper limit of the ratio of the other radio frequency region to the k-space is set on the basis of the ratio of the transition period to the imaging time period and the first pulse sequence.

As a result, when the MRI apparatus 100 according to the present example is used, by inputting the imaged site and the view share pattern through the UI related to the various types of settings regarding the present MT imaging method and using the steady state transition period time ratio as the reference information, it is possible to easily input the view share percentage. Consequently, the MRI apparatus 100 according to the present application example is able to enhance operability in relation to the various types of settings related to the present MT imaging method and to thus improve throughput of medical examinations.

When technical concepts of at least one aspect of the embodiments is realized as an image generating method, the image generating method includes: executing a first pulse sequence in which the application of the first MT pulse and the acquisition of the first MR signal corresponding to the radio frequency region in a part of the k-space are repeated in the transition period until the magnetization transitions into the steady state, whereas the application of the first MT pulse and the acquisition of the second MR signal corresponding to the low frequency region in the k-space are repeated in the steady state; executing the second pulse sequence in which the application of the second MT pulse different from the first MT pulse and the acquisition of the third MR signal corresponding to the radio frequency region are repeated in the transition period, whereas the application of the second MT pulse and the acquisition of the fourth MR signal corresponding to the low frequency region are repeated in the steady state; assigning the third MR signal to the radio frequency region in the other part of the k-space related to the first pulse sequence; and generating the MR image corresponding to the first pulse sequence on the basis of the first MR signal, the second MR signal, and the third MR signal. Because the procedure and advantageous effects of the MT map generating process implemented by the image generating method are the same as those of the embodiment, the explanations thereof will be omitted.

When the technical ideas in the embodiments are realized by a computer-readable non-volatile storage medium, the computer-readable non-volatile storage medium stores a medical image processing program that causes a computer to perform: in a first transition period in which a first Magnetization Transfer (MT) pulse is applied repeatedly until magnetization is transited to a first steady state, repeating application of the first MT pulse and acquisition of a first Magnetic Resonance (MR) signal corresponding to a radio frequency region that is a part of a k-space; in the first steady state, repeating application of the first MT pulse and acquisition of a second MR signal corresponding to a low frequency region of the k-space; in a second transition period in which a second MT pulse, which is different from the first MT pulse, is applied repeatedly until the magnetization is transited to a second steady state, repeating application of the second MT pulse and acquisition of a third MR signal corresponding to a further radio frequency region that is another part of the k-space different from the radio frequency region; and generating one MR image on basis of the first MR signal, the second MR signal, and the third MR signal. The procedures and effects of the MT map generating process performed by the image generating method by means of the medical image processing program stored in the computer-readable non-volatile storage medium are the same as those of the embodiments, and the explanation thereof is not repeated.

According to at least one aspect of the embodiments, the application examples, and the like described above, it is possible to shorten the imaging time period of the imaging process that uses the mutually-different magnetization transfer pulses.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Regarding the embodiments and the like described above, the following notes are disclosed as certain aspects and selected characteristics of the present disclosure.

Note 1:

A magnetic resonance imaging apparatus including:

sequence controlling circuitry configured to in a first transition period in which a first Magnetization Transfer (MT) pulse is applied repeatedly until magnetization is transited to a first steady state, repeat application of the first MT pulse and acquisition of a first Magnetic Resonance (MR) signal corresponding to a first frequency region that is a part of a k-space, in the first steady state, repeat application of the first MT pulse and acquisition of a second MR signal corresponding to a second frequency region of the k-space, frequency including the second frequency region being lower than frequency including the first frequency region, and in a second transition period in which a second MT pulse, which is different from the first MT pulse, is applied repeatedly until the magnetization is transited to a second steady state, repeat application of the second MT pulse and acquisition of a third MR signal corresponding to a third frequency region that is another part of the k-space different from the first frequency region, frequency including the third frequency region being higher than the frequency including the second frequency region; and processing circuitry configured to generate one MR image on basis of the first MR signal, the second MR signal, and the third MR signal.

Note 2:

The sequence controlling circuitry may be configured to perform, in the first steady state, the acquisition of the second MR signal multiple times in accordance with an addition number of times, and the processing circuitry may be configured to calculate an arithmetic mean of the second MR signals as many times as the addition number of times, thereby generating a low frequency addition signal, and generate the one MR image on basis of the first MR signal, the low frequency addition signal generated from the second MR signals, and the third MR signal.

Note 3:

The sequence controlling circuitry may be configured to perform, in the second transition period, the acquisition of the third MR signal multiple times in accordance with the addition number of times, and the processing circuitry may be configured to calculate an arithmetic mean of the third MR signals as many times as the addition number of times, thereby generating a radio frequency addition signal, and generate the one MR image on basis of the first MR signal, the low frequency addition signal generated from the second MR signals, and the radio frequency addition signal generated from the third MR signals.

Note 4:

The sequence controlling circuitry may be configured to acquire magnetic resonance signals of the second frequency region corresponding to a plurality of image types that have mutually-different MT pulses, and the processing circuitry may be configured to generate a first low frequency image on basis of the second MR signal, generate a plurality of low frequency images corresponding to the plurality of image types on basis of the magnetic resonance signals of the second frequency region, select, on basis of similarity levels between the plurality of low frequency images and the first low frequency image, an image type similar to the first low frequency image from among the plurality of low frequency images, and generate the one MR image on basis of the first MR signal, the second MR signal, and the third MR signal related to the selected image type.

Note 5:

The processing circuitry may be configured to add, as many times as the addition number of times, a plurality of MR signals of the second frequency region corresponding to a plurality of image types, thereby generating a plurality of addition signals corresponding to the plurality of image types, reconstruct a first low frequency image on basis of the low frequency addition signal, reconstruct a plurality of low frequency images corresponding to the plurality of image types on basis of the plurality of addition signals, select, in accordance with the addition number of times, a plurality of image types similar to the first low frequency image from among the plurality of low frequency images on basis of the similarity levels between the plurality of low frequency images and the first low frequency image, and add, as many times as the addition number of times, the plurality of third MR signals related to the plurality of selected image types, thereby generating the radio frequency addition signal.

Note 6:

The magnetic resonance imaging apparatus may further include:

a display configured to display an imaged site related to the acquisition of the first MR signal and the second MR signal, an imaging time period related to the acquisition of the first MR signal and the second MR signal, a ratio of the first transition period to the imaging time period, assignment setting information related to a setting for assignment of the third MR signal to the third frequency region of the k-space, a total imaging time period related to the acquisition of the first MR signal, the second MR signal, and the third MR signal, and a ratio of the third frequency region to the k-space; and an input apparatus configured to receive the imaged site, the assignment setting information, and the ratio of the third frequency region to the k-space.

Note 7:

An upper limit of the ratio of the third frequency region to the k-space may be set on basis of the ratio of the first transition period to the imaging time period and a pulse sequence related to the acquisition of the first MR signal and the second MR signal.

Note 8:

The magnetization may be longitudinal magnetization related to a proton. The first steady state and the second steady state may be states in which magnitude of the longitudinal magnetization related to the proton in an imaged subject becomes steady due to the application of a plurality of MT pulses.

Note 9:
The second frequency region may be a frequency region in which a contribution to contrast in the MR image is dominant.

Note 10:
Each of the first frequency region and the third frequency region may be a frequency region in which a contribution to a contour in the MR image is dominant.

Note 11:
The second frequency region may be a part of the k-space that includes at least center of the k-space.

Note 12:
Each of the first frequency region and the third frequency region may be a part of the k-space that does not include the second frequency region.

Note 13:
Each of the first frequency region and the third frequency region may have, in the k-space, a radio frequency band related to one or both of a phase encoding direction and a slice encoding direction.

Note 14:
An image generating method including:
in a first transition period in which a first Magnetization Transfer (MT) pulse is applied repeatedly until magnetization is transited to a first steady state, repeating application of the first MT pulse and acquisition of a first Magnetic Resonance (MR) signal corresponding to a first frequency region that is a part of a k-space;
in the first steady state, repeating application of the first MT pulse and acquisition of a second MR signal corresponding to a second frequency region of the k-space, frequency including the second frequency region being lower than frequency including the first frequency region;
in a second transition period in which a second MT pulse, which is different from the first MT pulse, is applied repeatedly until the magnetization is transited to a second steady state, repeating application of the second MT pulse and acquisition of a third MR signal corresponding to a third frequency region that is another part of the k-space different from the first frequency region, frequency including the third frequency region being higher than the frequency including the second frequency region; and
generating one MR image on basis of the first MR signal, the second MR signal, and the third MR signal.

Note 15:
A computer-readable non-volatile storage medium storing a medical image processing program that causes a computer to perform:
in a first transition period in which a first Magnetization Transfer (MT) pulse is applied repeatedly until magnetization is transited to a first steady state, repeating application of the first MT pulse and acquisition of a first Magnetic Resonance (MR) signal corresponding to a first frequency region that is a part of a k-space;
in the first steady state, repeating application of the first MT pulse and acquisition of a second MR signal corresponding to a second frequency region of the k-space, frequency including the second frequency region being lower than frequency including the first frequency region;
in a second transition period in which a second MT pulse, which is different from the first MT pulse, is applied repeatedly until the magnetization is transited to a second steady state, repeating application of the second MT pulse and acquisition of a third MR signal corresponding to a third frequency region that is another part of the k-space different from the first frequency region, frequency including the third frequency region being higher than the frequency including the second frequency region; and
generating one MR image on basis of the first MR signal, the second MR signal, and the third MR signal.

What is claimed is:

1. A magnetic resonance imaging apparatus comprising:
sequence controlling circuitry configured to
in a first transition period in which a first Magnetization Transfer (MT) pulse sequence is applied repeatedly until magnetization is transited to a first steady state, repeat application of the first MT pulse sequence and acquisition of a first Magnetic Resonance (MR) signal corresponding to a first frequency region that is a part of a k-space,
in the first steady state, repeat application of the first MT pulse sequence and acquisition of a second MR signal corresponding to a second frequency region of the k-space, a frequency of the second frequency region being lower than a frequency of the first frequency region, and
in a second transition period in which a second MT pulse sequence, which is different from the first MT pulse sequence, is applied repeatedly until the magnetization is transited to a second steady state, repeat application of the second MT pulse sequence and acquisition of a third MR signal corresponding to a third frequency region that is another part of the k-space different from the first frequency region, a frequency of the third frequency region being higher than the frequency of the second frequency region; and
processing circuitry configured to generate one MR image based on the first MR signal, the second MR signal, and the third MR signal.

2. The magnetic resonance imaging apparatus according to claim 1, wherein
the sequence controlling circuitry is configured to perform, in the first steady state, the acquisition of the second MR signal multiple times in accordance with an addition number of times, and
the processing circuitry is configured to
calculate an arithmetic mean of the second MR signals as many times as the addition number of times, thereby generating a low frequency addition signal, and
generate the one MR image based on the first MR signal, the low frequency addition signal generated from the second MR signals, and the third MR signal.

3. The magnetic resonance imaging apparatus according to claim 2, wherein
the sequence controlling circuitry is configured to perform, in the second transition period, the acquisition of the third MR signal multiple times in accordance with the addition number of times, and
the processing circuitry is configured to
calculate an arithmetic mean of the third MR signals as many times as the addition number of times, thereby generating a radio frequency addition signal, and
generate the one MR image based on the first MR signal, the low frequency addition signal generated from the second MR signals, and the radio frequency addition signal generated from the third MR signals.

4. The magnetic resonance imaging apparatus according to claim 3, wherein
the processing circuitry is configured to
add, as many times as the addition number of times, a plurality of MR signals of the second frequency region corresponding to a plurality of image types each corresponding to a different MT pulse sequence, thereby generating a plurality of addition signals corresponding to the plurality of image types,
reconstruct a first low frequency image based on the low frequency addition signal,
reconstruct a plurality of low frequency images corresponding to the plurality of image types based on the plurality of addition signals,
select, in accordance with the addition number of times and on the basis of similarity levels between the plurality of low frequency images and the first low frequency image, multiple image types from among the plurality of image types corresponding to those from among the plurality of low frequency images that are similar to the first low frequency image, and
add, as many times as the addition number of times, the plurality of third MR signals related to the selected multiple image types, thereby generating the radio frequency addition signal.

5. The magnetic resonance imaging apparatus according to claim 1, wherein
the sequence controlling circuitry is configured to acquire magnetic resonance signals of the second frequency region corresponding to a plurality of image types, each type corresponding to a different MT pulse_sequence, and
the processing circuitry is configured to
generate a first low frequency image based on the second MR signal,
generate a plurality of low frequency images corresponding to the plurality of image types based on the magnetic resonance signals of the second frequency region,
select, based on similarity levels between the plurality of low frequency images and the first low frequency image, an image type of the plurality of image types corresponding to one from among the plurality of low frequency images that is similar to the first low frequency image, and
generate the one MR image based on the first MR signal, the second MR signal, and the third MR signal related to the selected image type.

6. The magnetic resonance imaging apparatus according to claim 1, further comprising:
a display configured to display:
an imaged site related to the acquisition of the first MR signal and the second MR signal,
an imaging time period related to the acquisition of the first MR signal and the second MR signal,
a ratio of the first transition period with respect to the imaging time period,
assignment setting information related to a setting for assignment of the third MR signal to the third frequency region of the k-space,
a total imaging time period related to the acquisition of the first MR signal, the second MR signal, and the third MR signal, and
a ratio of the third frequency region with to the k-space; and an input apparatus configured to receive the imaged site, the assignment setting information, and the ratio of the third frequency region to the k-space.

7. The magnetic resonance imaging apparatus according to claim 6, wherein an upper limit of the ratio of the third frequency region to the k-space is set based on the ratio of the first transition period with respect to the imaging time period and a pulse sequence related to the acquisition of the first MR signal and the second MR signal.

8. The magnetic resonance imaging apparatus according to claim 1, wherein
the magnetization is longitudinal magnetization related to a proton, and
the first steady state and the second steady state are states in which a magnitude of the longitudinal magnetization related to the proton in an imaged subject becomes steady due to the application of a plurality of MT pulses.

9. The magnetic resonance imaging apparatus according to claim 1, wherein the second frequency region is a frequency region in which a contribution to contrast in the MR image is dominant.

10. The magnetic resonance imaging apparatus according to claim 1, wherein each of the first frequency region and the third frequency region is a frequency region in which a contribution to a contour in the MR image is dominant.

11. The magnetic resonance imaging apparatus according to claim 1, wherein the second frequency region is a part of the k-space that includes at least center of the k-space.

12. The magnetic resonance imaging apparatus according to claim 1, wherein each of the first frequency region and the third frequency region is a part of the k-space that does not include the second frequency region.

13. The magnetic resonance imaging apparatus according to claim 1, wherein each of the first frequency region and the third frequency region has, in the k-space, a radio frequency band related to one or both of a phase encoding direction and a slice encoding direction.

14. An image generating method comprising:
in a first transition period in which a first Magnetization Transfer (MT) pulse sequence is applied repeatedly until magnetization is transited to a first steady state, repeating application of the first MT pulse sequence and acquisition of a first Magnetic Resonance (MR) signal corresponding to a first frequency region that is a part of a k-space;
in the first steady state, repeating application of the first MT pulse sequence and acquisition of a second MR signal corresponding to a second frequency region of the k-space, frequency of the second frequency region being lower than a frequency of the first frequency region;
in a second transition period in which a second MT pulse sequence, which is different from the first MT pulse sequence, is applied repeatedly until the magnetization is transited to a second steady state, repeating application of the second MT pulse and acquisition of a third MR signal corresponding to a third frequency region that is another part of the k-space different from the first frequency region, a frequency of the third frequency region being higher than the frequency of the second frequency region; and
generating one MR image based on the first MR signal, the second MR signal, and the third MR signal.

15. A non-transitory computer-readable medium storing a medical image processing program that causes a computer to perform:

in a first transition period in which a first Magnetization Transfer (MT) pulse sequence is applied repeatedly until magnetization is transited to a first steady state, repeating application of the first MT pulse sequence and acquisition of a first Magnetic Resonance (MR) signal corresponding to a first frequency region that is a part of a k-space;

in the first steady state, repeating application of the first MT pulse sequence and acquisition of a second MR signal corresponding to a second frequency region of the k-space, a frequency of the second frequency region being lower than a frequency of the first frequency region;

in a second transition period in which a second MT pulse sequence, which is different from the first MT pulse sequence, is applied repeatedly until the magnetization is transited to a second steady state, repeating application of the second MT pulse sequence and acquisition of a third MR signal corresponding to a third frequency region that is another part of the k-space different from the first frequency region, a frequency of the third frequency region being higher than the frequency of the second frequency region; and generating one MR image based on the first MR signal, the second MR signal, and the third MR signal.

* * * * *